(12) United States Patent
Swager et al.

(10) Patent No.: US 7,041,910 B2
(45) Date of Patent: May 9, 2006

(54) EMISSIVE, HIGH CHARGE TRANSPORT POLYMERS

(75) Inventors: Timothy M. Swager, Newton, MA (US); Steffen Zahn, Pennsburg, PA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/621,041

(22) Filed: Jul. 15, 2003

(65) Prior Publication Data

US 2004/0116650 A1    Jun. 17, 2004

Related U.S. Application Data

(60) Provisional application No. 60/396,028, filed on Jul. 15, 2002.

(51) Int. Cl.
   *H01B 7/00*    (2006.01)
(52) U.S. Cl. ............... 174/110; 252/299.4; 252/582; 257/E21.259; 349/1; 428/11; 525/63
(58) Field of Classification Search ............. 174/110; 252/582, 299.4; 428/11; 257/E21.259; 349/1; 525/63
   See application file for complete search history.

(56) References Cited

U.S. PATENT DOCUMENTS

| | | | |
|---|---|---|---|
| 4,356,429 A | 10/1982 | Tang | |
| 4,687,732 A | 8/1987 | Ward et al. | |
| 4,927,768 A | 5/1990 | Coughlin et al. | |
| 4,946,890 A | 8/1990 | Meador | |
| 4,992,302 A | 2/1991 | Lindmayer | |
| 5,155,149 A | 10/1992 | Atwater et al. | |
| 5,194,393 A | 3/1993 | Hugl et al. | |
| 5,236,808 A | 8/1993 | Smothers | |
| 5,244,813 A | 9/1993 | Walt et al. | |
| 5,254,633 A | 10/1993 | Han et al. | |
| 5,364,797 A | 11/1994 | Olson et al. | |
| 5,414,069 A | 5/1995 | Cumming et al. | |
| 5,451,683 A | 9/1995 | Barrett et al. | |
| 5,511,547 A | 4/1996 | Markle et al. | |
| 5,512,490 A | 4/1996 | Walt et al. | |
| 5,532,129 A | 7/1996 | Heller | |
| 5,540,999 A | 7/1996 | Yamamoto et al. | |
| 5,546,889 A | 8/1996 | Wakita et al. | |
| 5,554,747 A | 9/1996 | Sharma et al. | |
| 5,556,524 A | 9/1996 | Albers | |
| 5,563,056 A | 10/1996 | Swan et al. | |
| 5,565,322 A | 10/1996 | Heller | |
| 5,580,527 A | 12/1996 | Bell et al. | |
| 5,585,646 A | 12/1996 | Kossovsky et al. | |
| 5,591,787 A | 1/1997 | Schlennert et al. | |
| 5,597,890 A | 1/1997 | Jenekhe | |
| 5,607,864 A | 3/1997 | Ricchiero et al. | |
| 5,679,773 A | 10/1997 | Holmes | |
| 5,700,696 A | 12/1997 | Chandross et al. | |
| 5,705,348 A | 1/1998 | Meade et al. | |
| 5,709,994 A | 1/1998 | Pease et al. | |
| 5,710,197 A | 1/1998 | Fischer et al. | |
| 5,723,218 A | 3/1998 | Haugland et al. | |
| 5,869,562 A | 2/1999 | Lindquist et al. | |
| 6,020,426 A | 2/2000 | Yamaguchi et al. | |
| 6,259,277 B1 | 7/2001 | Tour et al. | |
| 6,589,731 B1 | 7/2003 | Chen et al. | |
| 6,713,298 B1 | 3/2004 | McDevitt et al. | |
| 2002/0040805 A1 | 4/2002 | Swager | |
| 2002/0150697 A1 | 10/2002 | Swager et al. | |
| 2003/0134959 A1 | 7/2003 | Hancock et al. | |
| 2003/0178607 A1 | 9/2003 | Swager et al. | |
| 2004/0043251 A1 | 3/2004 | Epstein et al. | |
| 2004/0121337 A1 | 6/2004 | Deans et al. | |
| 2004/0235184 A1 | 11/2004 | Swager | |

FOREIGN PATENT DOCUMENTS

| | | |
|---|---|---|
| DE | 19744792 A1 | 4/1999 |
| DE | 19806037 A1 | 8/1999 |
| EP | 0442123 A1 | 8/1991 |
| EP | 0933655 A1 | 8/1999 |
| EP | 1011154 A1 | 6/2000 |

(Continued)

OTHER PUBLICATIONS

Zahn, S., et al., Three-Dimensional Electronic Delocalization in Chiral Conjugated Polymers, *Agnew. Chem. Int. Ed.*, 2002, 41, No. 22, p. 4225-4230, WILEY-VCH Verlag Gmbh & Co., KGaA, Weinheim.

(Continued)

*Primary Examiner*—Bernard Lipman

(57) ABSTRACT

The present invention generally relates to stable emissive aggregates of polymers. The aggregates are composed of various polymer molecules arranged in such a way as to allow extended electronic couplings between nearby polymer molecules, enhancing exciton transport, while minimizing the effects of quenching due to interchain interactions. For example, the polymer molecules may be arranged in a non-aligned, electronically-communicative manner (for example, at an oblique angle), stabilized by various methods such as chemical linkages or physical interactions. Within the aggregate, electronic interactions along the polymer molecule may extend to nearby polymer molecules, which may be observed as a shift in the absorption spectra relative to a random dispersion. Light emitted from the aggregate may be polarized in some cases, for example, linearly or circularly, which may be caused by chiral arrangements of polymers within the aggregate (the polymers themselves may or may not be chiral). These aggregates may find widespread use, for example, in enantiomeric detectors, electrochemical devices, photodetectors, organic diodes, sensors, light sources, or photovoltaic devices.

103 Claims, 18 Drawing Sheets

FOREIGN PATENT DOCUMENTS

| JP | 06-322078 A1 | 11/1999 |
|---|---|---|
| WO | WO 89/00593 A1 | 1/1989 |
| WO | WO 95/16681 A1 | 6/1995 |
| WO | WO 99/57222 A1 | 11/1999 |
| WO | WO 01/57140 A1 | 8/2001 |
| WO | WO 02/16463 A2 | 2/2002 |
| WO | WO 03/048226 A2 | 6/2003 |
| WO | WO 04/007634 A2 | 1/2004 |
| WO | WO 04/057014 A2 | 7/2004 |

OTHER PUBLICATIONS

Brabec, C., et al. "Plastic Solar Cells"," *Adv. Funct. Mater*, 11(1), (2001), pp. 15-26.

Chen, L., et al., "Highly sensitive biological and chemical sensors based on reversible fluorescence quenching in a conjugated polymer," *PNAS*, 96(22), (1999), pp.: 12287-12292.

Chen, L., et al., "Tuning the Properties of Conjugated Polyelectrolytes through Surfactant Complexation," *Journal of the American Chemical Society*, 122, pp. 9302-9303.

Cotts, P.M., et al., "Equilibrium Flexibility of a Rigid Linear Conjugated Polymer," *Macromolecules*, 29 (1996), pp. 7323-7328.

Deans, R., et al., "A Poly(p-phenyleneethynylene) with a Highly Emissive Aggregated Phase"," *Journal of the American Chemical Society*, 122 (2000), pp. 8565-8566.

Fiesel, R., et al., "Aggregation-induced CD effects in chiral poly(2,5-dialkoxy-1,4-phenylene)s," *Acta Polym.*, 49, (1998), pp. 445-449.

Fiesel, R., et al., "A chiral poly(*para*-phenyleneethynylene) (PPE) derivative," *Macromol. Rapid Commun.*, 19, (1998), pp. 427-431.

Fiesel, R., et al., "On the Solid State Aggregation of Chiral Substituted Poly(*para*-phenylene)s (PPPs)," *Synthetic Metals*, 102, (1999), pp. 1457-1458.

Fu, D., et al., "Alternating Poly(PyridylVinyenePhenylene Vinylene)s: Synthesis and Solid State Organizations," *Tetrahedron*, 53(45), (1997), pp.: 15487-15494.

Gaylord, B.S., et al., "DNA detection using water-soluble conjugated polymers and peptide nucleic acid probes," *PNAS*, 99 (17), (2002), pp. 10954-10957.

Gaylord, B., et al., "Water-Soluble Conjugated Oligomers: Effect of Chain Length and Aggregation on Photoluminescence-Quenching Efficiencies," *J. Am. Soc.*, 123, (2001), pp.: 6417-6418.

Goldfinger, M. et al., "Fused Polycyclic Aromatics via Electrophile-Induced Cyclization Reactions: Application to the Synthesis of Graphite Ribbons", *Journal of the American Chemical Society*, 116, (1994), pp. 7895-7896.

Halkyard, C.E., "Evidence of Aggregate Formation of 2,5-Dialkylpoly (p-phenyleneethynylenes) in Solution and Thin Films," *Macromolecules*, 31(25), (1998), pp.: 8655-8659.

Harrison, B.S., et al., "Amplified Fluorescence Quenching in a Poly(p-phenylene)-Based Cationic Polyelectrolyte," *J. Am. Chem. Soc.*, 122, (2000), pp.: 8561-8562.

Heeger, P.S., et al., "Making sense of polymer-based biosensors," *PNAS*, 96(22), (1999), pp.: 12219-12221.

Höger S., et al., "Synthesis, Aggregation, and Adsorption Phenomena of Shape-Persistent Macrocycles with Extraannular Polyalkuly Substituents," *Journal of the American Chemical Society*, 123(24), (2001), pp. 5651-5659.

Jones, R.M., et al., "Superquenching and Its Applications in J-Aggregated Cyanine Polymers," *Langmuir*, 17, (2001), pp. 2568-2571.

Kim, J., et al., "Nanoscale Fibrils and Grids: Aggregated Structures from Rigid-Rod Conjugated Polymers," *Macromolecules*, 32(5), (1999), pp.: 1500-1507.

Kim, J., et al., "Ion-Specific Aggregation in Conjugated Polymers: Highly Sensitive and Selective Fluorescent Ion Chemosensors," *Agnew Chem. Int. Ed.*, 39(21), (2000), pp. 3868-3872.

Kim, J., et al., "Control of conformational and interpolymer effects in conjugated polymers," *Nature*, 411, (2001), pp. 1030-1034.

Kim, J., et al., "Directing Energy Transfer within Conjugated Polymer Thin Films," *Journal of the American Chemical Society*, 123(46), (2001), pp. 11488-11489.

Kim, J., et al., "Structural Control in Thin Layers of Poly) P-phenyleneethynylene)s: Photophysical Studies of Langmuir and Langmuir-Blodgett Films," *Journal of the American Chemical Society*, 124 (26), (2002), p. 7710.

Kim, Y., et al., "Ultrafast Energy-Transfer Dynamics between Block Copolymer and π-Conjugated Polymer Chains in Blended Polymeric Systems," *Chemistry of Materials*, 13(8), 266.

Köhler, B., et al., "Novel Chiral Macrocycles Containing Two Electronically Interacting Arylene Chromophores," *Chem. Eur. J.*, 7(14), (2001), pp. 3000-3004.

Kraft, A., et al., "Electroluminescent Conjugated Polymers—Seeing Polymers in a New Light," *Agnew. Chem. Int. Ed.*, 37, (1998), pp. 402-428.

Kushon, S.A., et al., "Detection of DNA Hybridization via Fluorescent Polymer Superquenching," *The ACS Journal of Surfaces and Colloids*, 18(20), (2002), pp. 7245-7249.

Langveld, B.M.W., et al., "Circular Dichroism and Circular Polarization of Photoluminescence of Highly Ordered Poly {3,4-di[(*S*)-2-methylbutoxy]thiophene}," *Journal of the American Chemical Society*, 118, (1996), pp. 4908-4909.

Levitsky, I.A., et al., "Energy Migration in a Poly(phenylene ethynylene): Determination of Interpolymer Transport in Anisotropic Langmuir-Blodgett Films," *J. Am. Chem. Soc.*, 121(7), (1999), pp.: 1466-1472.

Levitsky, I.A.., et al., "Mass and Energy Transport in Conjugated Polymer Langmuir-Blodgett Films; Conductivity, Fluorescence, and UV-Vis Studies," *Macromolecules*, 34, (2001), pp. 2315-2319.

Li, M., et al., "Novel Surfactant-Free Stable Colloidal Nanoparticles Made of Randomly Carboxylated Polystyrene Ionomers," *Macromolecules*, 30, (1997), pp.: 2201-2203.

Luo, L., et al., "Thermodynamic Stabilization Mechanism of Block Copolymer Vesicles," *Journal of the American Chemical Society*, 123(5), (2001), pp. 1012-1013.

McQuade, D.T., et al., "Conjugated Polymer-Based Chemical Sensors," *Chem. Rev.*, 100,(2000), pp. 2537-2574.

McQuade, D.T., et al., "Two-Dimensional Conjugated Polymer Assemblies: Interchain Spacing for Controls of Photophysics," *Journal of the American Chemical Society*, 122, (2000), pp. 5885-5886.

Miao, Y., et al., "Fluorescence Sensory Polymers Containing Rigid Non-planar Aromatic Scaffolds," *Poly. Prep. Div. Poly. Chem ACS*, 39, pp. 1081-1082.

Mitschke, U. et al., "The electroluminescence of organic materials," *J. Mater. Chem.*, 10, (2000), pp. 1471-1507.

Moon, J.H., et al., "Capture and detection of a quencher labeled oligonucleotide by poly)phenylene ethnylene) particles," *Chem. Commun.*, 1, (2003), pp. 104-105.

Norvez, S., et al., "Epitaxygens: mesomorphic properties of triptycene derivatives," *Liquid Chemicals*, 14(5), (1993), pp. 1389-1395.

Oda, M., et al., "Circularly Polarized Electroluminescence from Liquid-Crystalline Chiral Polyfluorenes," *Advanced Materials*, , 12(5), (2000), pp. 362-365.

Oda, M.., et al., "Chiroptical properties of chiral-substituted polyfluorenes," *Synthetic Metals*,111-112, (2000), pp. 575-577.

Peng, K., et al., "Efficient Light Harvesting by Sequential Energy Transfer across Aggregates in Polymers of Finite Conjugational Segments with Short Aliphatic Linkages," *J. Am. Chem. Soc.*, 123, (2001), pp. 11388-11397.

Peeters, E., et al., "Circularly Polarized Electroluminescence from a Polymer Light-Emitting Diode," *Journal of the American Chemical Society*, 119, (1997), pp. 9909-9910.

Place, I., et al., "Stabilization of the Aggregation of Cyanine Dyes at the Molecular and Nanoscopic Level," *Langmuir*, 16, (2000), pp.: 9042-9048.

Pschirer, N.G., et al., "Poly(fluorenyleneethnylene)s by Alkyne Metathesis: Optical Properties and Aggregation Behavior," *Macromolecules*, 33, (2000), pp.: 3961-3963.

Snow, A.W., et al., "Synthesis and Evaluation of Hexafluorodimethylcarbinol Functionalized Polymers as Microsensor Coatings," *J. App. Polymer Science*, 43, (1991), pp.: 1659-1671.

Swager, T.M., et al., "Fluorescence Studies of Poly(*p*-phenyleneethynylene)s: The Effect of Anthracene Substitution," *J. Phys. Chem.*, 99, (1995), pp.: 4886-1893.

Swager, T.M., et al., "The Molecular Wire Approach to Sensory Signal Amplification," *Acct. of Chem. Research*, 31(5), (1998), pp.: 201-207.

Tan, C., et al., "Photophysics, aggregation and amplified quenching of a wter-soluble poly(phenylene ethynylene)," *Chem. Commun.*, (2002), pp. 446-447.

Van Houten, K.A., et al., "Rapid Luminescent Detection of Phosphate Esters in Solution and the Gas Phase Using (dppe)Pt{S2C2(2-pyridyl)(CH2CH2OH)}," *J. Am. Chem. Soc.*, 120, (1998), pp.: 12359-12360.

Walters, K.A., et al., "Photophysical Consequences of Conformation and Aggregation in Dilute Solutions of π-Conjugated Oligomers," *Langmuir*, 15, (1999), pp. 5676-5680.

Weder, C., et al., "Efficient Solid-State Photoluminescence in New Poly(2.5-dialkoky-p-phenyleneeethynylene)s," *Macromolecules*, 29, (1996), pp.: 5157-5165.

Wu, C., et al., "Novel Nanoparticles Formed via Self-Assembly of Poly(ethylene glycol-b-sebacic anhydride) and Their Degradation in Water," *Macromolecules*, 33, (2000), pp.: 9040-9043.

Yang, J., et al., "Porous Shape Persistent Fluorescent Polymer Films: An Approach to TNT Sensory Materials," *Journal of the American Chemical Society*, 120(21), (1998), pp. 5321-5322.

Yang, J., et al., "Fluorescent Porous Polymer Films as TNT Chemosensors: Electronic and Structural Effects," *J. Am. Chem. Soc.*, 120(46), (1998), pp. 11864-11873.

Yang, J., et al., "Anomalous crystal packing of iptycene secondary diamides leading to novel chain and channel networks," *Tetrahedron Letters*, 41, Issue 41, (2000), pp. 7911-7915.

Zhang, G., et al., "Formation of Novel Polymeric Nanoparticles," *Acc. Chem. Res.*, 34, (2001), pp.: 249-256.

Zhang, S., et al., "Fluorescent Detection of Chemical Warfar Agents: Specific Ratiometric Chemosensors,".

Zhou, Q., et al., "Methodology for Enhancing the Sensitivity of Fluorescent Chemosensors: Energy Migration In Conjugated Polymers," *Journal of the American Chemical Society*, 117(26). (1995), pp. 7017-7018.

Zhou, Q., et al., "Fluorescent Chemosensors Based on Energy Migration in Conjugated Polymers: The Molecular Approach to Increased Sensitivity," *J. Am. Chem. Soc.*, 117(50), (1995), pp.: 12593-12602.

International Search Report for PCT/US03/22702 mailed Jan. 29, 2004.

Fiesel, et al, "Aggregation and chiroptical behavior of a high molecular weight chirally substituted dialkylpoly (*p*-phenyleneethynylene)", Macromol Rapid Commun., vol. 20, pp. 107-111 (1999).

Cornil, et al., "Influence of Interchain Interactions on the Absorption and Luminescence of Conjugated Oligomers and Polymers: A Quantum-Chemical Characterization", J. Am. Chem. Soc., vol. 120, pp. 1289-1299 (1998).

FOR x = y = 1

R': 2-NAPHTHALENE; H; CH$_3$; i-C$_3$H$_7$; OCH$_3$; OC$_2$H$_5$; OC$_4$H$_9$; OC$_6$H$_{13}$; OCH$_2$CH(C$_2$H$_5$)C$_4$H$_9$; OC$_8$H$_{17}$; OC$_{10}$H$_{21}$; OC$_{16}$H$_{33}$;

R":

FOR x = 1; y = 0

R':

FOR x = 1-4; y = 1,3

R': OC$_4$H$_9$;   R":

EMISSIVE, HIGH CHARGE TRANSPORT POLYMERS

RELATED APPLICATIONS

This application claims priority under 35 U.S.C. § 119(e) to U.S. Provisional application Ser. No. 60/396,028, entitled EMISSIVE, HIGH CHARGE TRANSPORT POLYMERS, filed on Jul. 15, 2002, which is herein incorporated by reference in its entirety.

GOVERNMENT FUNDING

This invention was made government support under Contract Number DE-FG07-01ID14222, awarded by DOE, and Subcontract Number 398614, awarded by ARO. The government has certain rights in the invention.

BACKGROUND

1. Field of the Invention

This invention generally relates to emissive polymers and, in particular, to emissive aggregates of polymers.

2. Description of the Related Art

Transport properties are important performance determinants of electronic materials in most applications. Strong, extended electronic interactions can be critical to obtaining molecules and polymers with high charge carrier mobility. Strong electronic coupling is also a major contributor to intermolecular and intramolecular exciton transport in some conjugated polymers. Thus, producing extended electronic interactions both within and between electronic polymers can be critical to optimizing the transport of charge and excitons that underpins applications such as transistors, electroluminescent devices, sensors, photovoltaics, and the like. However, in devices requiring luminescence or exciton transport, some studies have generally avoided strong interpolymer electronic coupling. The degree of self-quenching that accompanies these interactions lowers the light output of the luminescent devices and may also lower the diffusion length of excitons, which may reduce responses. As a result, most studies have used larger structures such as dendrimers or smaller rigid scaffolds to prevent interchain interactions. Thus, the general principles for maintaining high emission quantum yields in electronic polymers ("emissivity") have been opposed to those for the optimization of charge and exciton transport ("conductivity") in polymer aggregations.

SUMMARY OF THE INVENTION

This invention generally relates to emissive aggregates of polymers. The subject matter of this application involves, in some cases, interrelated products, alternative solutions to a particular problem, and/or a plurality of different uses of a single system or article.

In one aspect, the invention provides an aggregate composition. The aggregate comprises a plurality of polymer molecules, each polymer molecule, prior to aggregation, comprising at least 7 monomer units or having a molecular weight of at least 7000 g/mol, having a fluorescence quantum yield of at least 2%, being electrically conductive or semiconductive, and having electrical properties such that electronic interactions extend at least 2 monomer units from their source such that a spectral comparison of one of the monomer units to the polymer molecule comprising such unit demonstrates a change in gap between the highest filled molecular or electronic orbital and the lowest unfilled molecular or electronic orbital of the monomer unit versus the polymer molecule of at least 0.1 eV. The aggregate comprises the plurality of polymer molecules arranged in a non-aligned, electronically-communicative manner providing a fluorescence quantum yield for the aggregate at least 0.05 times that of the individual quantum yields of the polymer molecules, an absorption spectrum having a unique, red-shifted absorption relative to an absorption spectrum of a random dispersion of the polymer molecules, and being stable in the absence of solvent for at least one minute in air at no less than 50 degrees Celsius, as indicated by a change in quantum yield of no greater than 5% and a change in wavelength of the unique absorption of no more than 5%.

In another aspect, the invention is directed to a method of making any of the embodiments described herein. In yet another aspect, the invention is directed to a method of using any of the embodiments described herein.

Other advantages, novel features, and objects of the invention will become apparent from the following detailed description of non-limiting embodiments of the invention when considered in conjunction with the accompanying drawings, which are schematic and which are not intended to be drawn to scale. In the figures, each identical or nearly identical component that is illustrated in various figures typically is represented by a single numeral. For purposes of clarity, not every component is labeled in every figure, nor is every component of each embodiment of the invention shown where illustration is not necessary to allow those of ordinary skill in the art to understand the invention. In cases where the present specification and a document incorporated by reference include conflicting disclosure, the present specification shall control.

BRIEF DESCRIPTION OF THE DRAWINGS

Non-limiting embodiments of the present invention will be described by way of example with reference to the accompanying drawings in which.

DETAILED DESCRIPTION

Figure 1A:
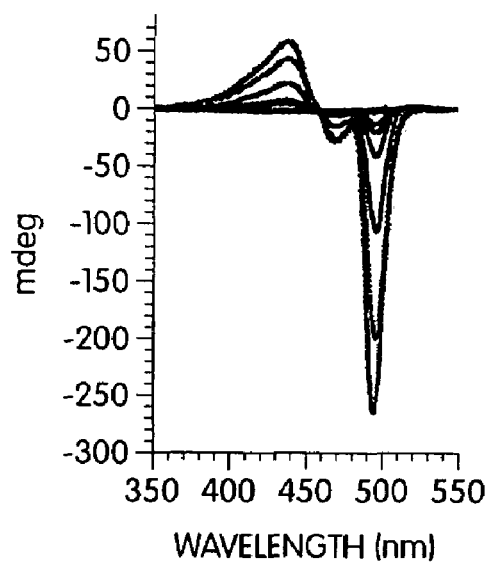
FIG. 1A–FIG. 1F are plots that illustrate circular dichroism (FIGS. 1A and 1B), absorption (FIGS. 1C and 1D), and fluorescent spectra (FIGS. 1E and 1F) of an unstable polymer.
Figure 1B:
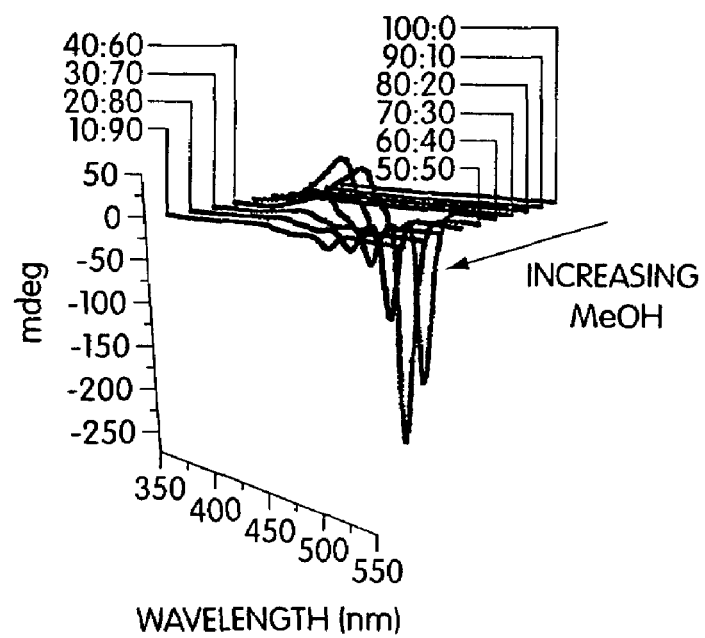
Figure 1C:
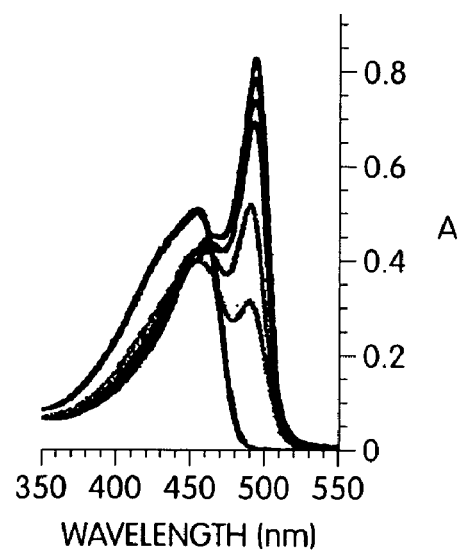
Figure 1D:
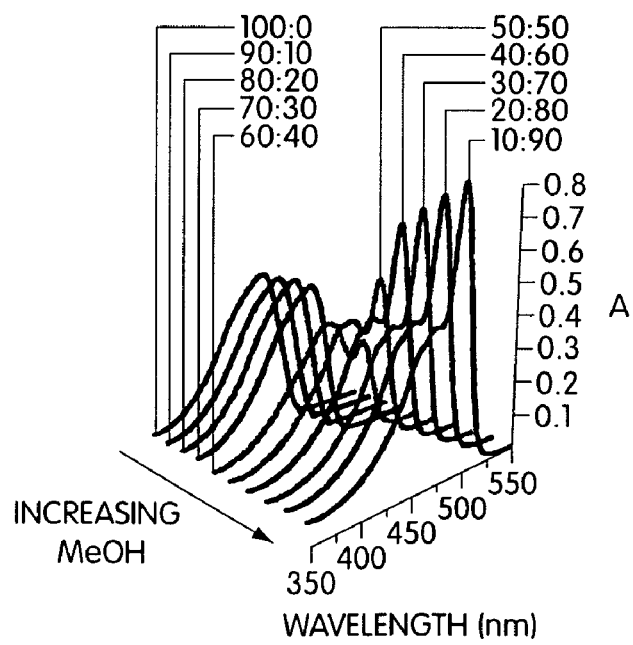
Figure 1E:
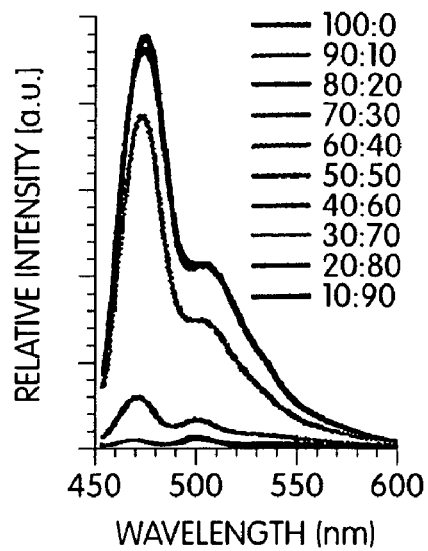
Figure 1F:
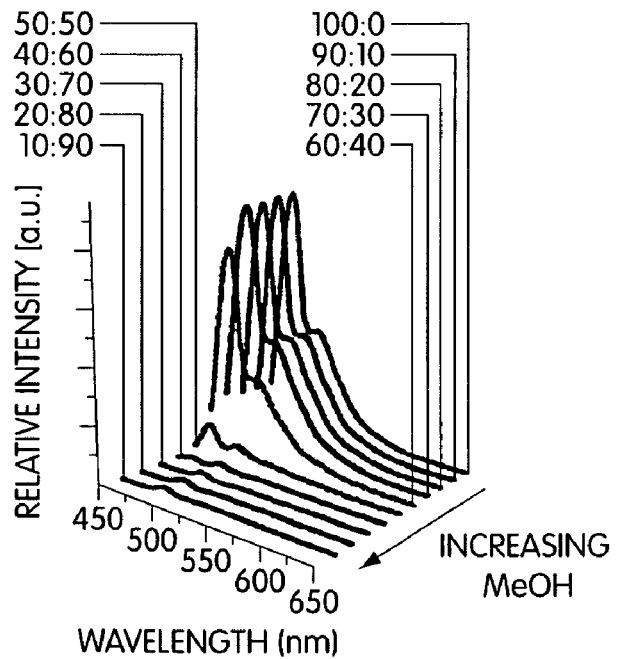

The present invention generally relates to stable emissive aggregates of polymers. The aggregates can be composed of various polymer molecules arranged in such a way as to allow extended electronic couplings between nearby polymer molecules, enhancing exciton transport, while minimizing the effects of quenching due to interchain interactions. For example, the polymer molecules may be arranged in a non-aligned, electronically-communicative manner (for example, at an oblique angle), stabilized by various methods such as chemical linkages or physical interactions. Within the aggregate, electronic interactions along the polymer molecule may extend to nearby polymer molecules, which may be observed as a shift in the absorption spectra relative to a random dispersion. Light emitted from the aggregate may be polarized in some cases, for example, linearly or circularly, which may be caused by chiral arrangements of polymers within the aggregate (the polymers themselves may or may not be chiral). These aggregates can find widespread use, for example, in enantiomeric detectors, electrochemical devices, photodetectors, organic diodes, sensors, light sources, or photovoltaic devices.

An "exciton," as used herein, is an energetically-excited state which gives changes in the degree of bonding in the polymer over finite dimensions resulting from the absorption of a quantum or unit of energy (for example, an incident photon), from the combination of two charge carriers of opposite charge (for example from condensation of a cation-radical and an anion-radical), or from a reaction with a high energy molecule (for example chemiluminescence) This excited state may be electronically delocalized over one or more polymer chains. In one embodiment, the exciton may be used to produce charged carriers; in other embodiments, however, the exciton comprises an high-energy state electron or a pair of electrons that may, for example, exhibit coupled movement. In some cases, the exciton may be transported along a polymer molecule or between polymer molecules before being released, or absorbed as heat. Energy (for example, an incident photon), interacting with a polymer molecule may be absorbed by an electron of an atom within the molecule, allowing the electron to go from a lower energy state into an "excited" or higher energy state, creating an "exciton" within the molecule. The site within the molecule where energy is absorbed to form the exciton may be referred to as the activation site. One form of energy excitation is by the interaction of the polymer molecule with an incident photon corresponding to visible light, ultraviolet light, or other electromagnetic frequencies. However, other methods of excitation are also possible, for example, through incident electrons, electrical current, friction, heat, chemical or biological reactions, the influence of sound waves, etc. Exciton transport may be facilitated by electronic interactions within the polymer molecule ("intrachain"), such as with conjugated groups, for example, extending at least 2 monomer units from the source or activation site. Energy transport may also be facilitated by electronic interactions between different polymer molecules ("interchain").

A principal relevant to several aspects of the invention may be understood with reference to FIG. 2. FIG. 2A illustrates randomly oriented polymer molecules (for example, as in a solution or a dispersion). Although substantial intrachain exciton transport may occur (i.e., within a single polymer molecule), due to the spacing and orientation of the polymer molecules, substantial interchain exciton transport (i.e., between individual polymer molecules) is unable to occur.

Figure 2A:
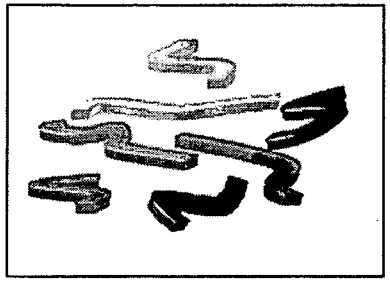
FIG. 2A–FIG. 2F are schematic diagrams of various stages of aggregation and chirality.
Figure 2D:
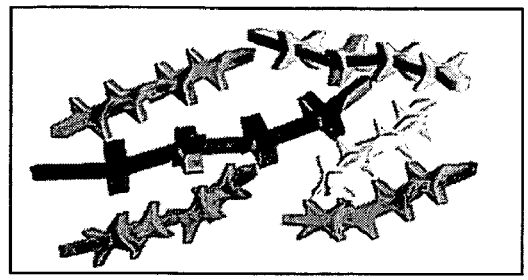
Figure 2B:
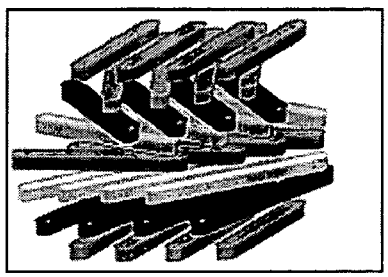
Figure 2E:
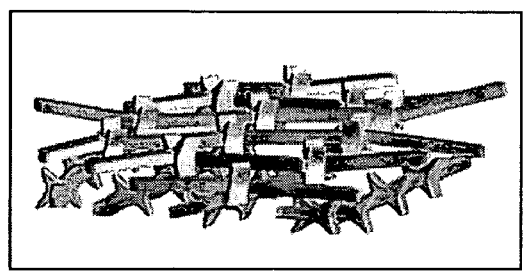
Figure 2C:
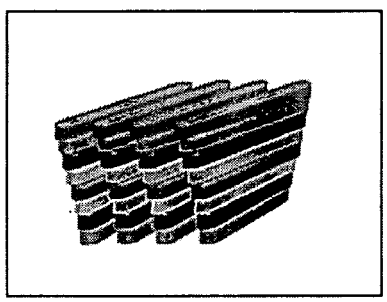

In contrast, in FIG. 2C, the polymer molecules are aligned, for example, as in a crystal or a thin film. Although there may be strong intermolecular electronic coupling between nearby polymer molecules, resulting in high conductivities, quenching between nearby molecules may reduce the emissivity and also exciton transport.

An intermediate configuration, representing one aspect of the invention, is illustrated in FIG. 2B. In this configuration, the polymer molecules are close enough to allow interchain electronic interactions between nearby polymer molecules, while remaining non-aligned, reducing the effects of quenching due to interchain interactions, for example, due to pi-stacking. As used herein, two molecules that are "non-aligned" are positioned non-parallel to each other, for example, one molecule may be at an angle relative to the other (e.g., at an angle substantially greater than about 5 or 10 degrees, including perpendicular and antiparallel orientations), or are longitudinally translated relative to the other to the extent that quenching is substantially suppressed. This configuration may be stably formed by any suitable technique, for example, through chemical interactions between the polymer molecules, or through steric or other physical interactions between the polymer molecules. In this configuration, excitons may be transmitted through intrachain pathways within a single polymer molecule, through interchain pathways between different polymer molecules, or combinations of interchain and intrachain pathways.

In one set of embodiments, the exciton can be released as fluorescence. The fluorescence can be "quenched" when a chromophore in an excited state (i.e., one that contains an exciton) is exposed to an "acceptor" species that can absorb energy from the excited state chromophore. The excited acceptor may then fluoresce. A "chromophore" refers to a species that can either absorb or emit electromagnetic radiation, and may be located anywhere within the polymer molecule, for example, within the backbone (i.e., the longest continuous bond pathway of the polymer), as a pendent group, as a chromophore monomer unit, or interspersed between other conjugated groups (in particular, if the chromophore itself may participate in conjugation). In one embodiment, the chromophore is capable of absorbing or emitting radiation having ultraviolet or visible frequencies, i.e. absorbed or emitted energy involving excited electronic states. In one embodiment, the chromophore is a conjugated group. A "conjugated group" refers to an interconnected chain of at least three atoms, each atom participating in delocalized pi-bonding. In another embodiment, the chromophore is chiral. The excited state chromophore returns to a ground state due to nonradiative processes (i.e. without emitting radiation), resulting in a reduced quantum yield. "Quantum yield" refers to a number of photons emitted per adsorbed photon. Thus, the excited state chromophore can function as a "donor" species in that it transfers energy to the acceptor species. The acceptor species can be an external molecule such as another polymer or an internal species such as another portion of the same polymer. In particular, certain polymer molecules can undergo a phenomena known as "pi-stacking," which involves conjugated interactions between the pi-orbitals of nearby polymer molecules. A pi-stacking arrangement can facilitate energy transfer between donor and acceptor species and increase the likelihood of quenching. The capability for pi-stacking may be considerably enhanced when the polymer is in the solid state, i.e. not in solution.

In one embodiment, the polymer has at least one conjugated portion. In such an arrangement, electron density or electronic charge may be conducted along the portion where the electronic charge is referred to as being "delocalized." Each p-orbital participating in conjugation can have sufficient overlap with adjacent conjugated p-orbitals.

In one embodiment, the conjugated portion is at least about 3 nm in length. In another embodiment, substantially the entire backbone is conjugated and the polymer is referred to as a "conjugated polymer." Polymers having a conjugated pi-backbone capable of conducting electronic charge are typically referred to as "conducting polymers," and may show enhanced conductivity relative to non-conjugated polymers. Typically, atoms directly participating in the conjugation form a plane, the plane arising from a preferred arrangement of the p-orbitals to maximize p-orbital overlap, thus maximizing conjugation and electronic conduction. An example of a conjugated pi-backbone defining essentially a plane of atoms are the carbon atoms of a polyacetylene chain. In certain embodiments, the electron delocalization may also extend to adjacent polymer molecules, such as between two chromophores.

In a delocalized structure, the electrons in the p-orbitals forming the pi bond may cover multiple atom centers, which are said to be in "pi-communication" or "pi-electron communication." As used herein, "pi-orbitals," "pi structures," "pi-backbone," and the like are given their ordinary definitions as is understood in chemistry, where the electrons in orbitals between adjacent atoms are shared, creating a chemical bond between the adjacent atoms. Similarly, "pi-stacking" or "intermolecular pi-pi interactions" generally refers to structures in which the pi-orbitals of nearby molecules are adjacent, overlapping, or otherwise affect each others' properties, for example, by changing the rate of the release of photons by excitons or by introducing other mechanisms by which excitons release energy in the form of heat.

Delocalization and/or conjugation may be observed in a wide variety of structures, for example, but not limited to, double bonds, triple bonds, benzene rings, naphthalene rings, anthracene rings, pyridines, porphyrins, thiophenes, bipyridines, phenanthrolenes, carbazoles, and the like. Other aromatic systems having similar arrangements of atoms to produce delocalized pi-bonds can also be useful in the invention, as well as moieties containing delocalized pi structures having additional substituents, such as oxygen, sulfur, nitrogen, a halogen, or the like. For example, nitrogen atoms may be substituted for carbon atoms within a delocalized pi structure, such as in pyridines and similar compounds.

An exciton may be transmitted along the energy migration pathway of the polymer by intrachain transfer, for example, along a pi backbone due to the presence of delocalized pi-orbitals. The pi backbone, or other analogous structures, that are able to transmit the exciton may also be referred to as "energy migration pathways." In some cases, the pi backbone amplifies the effect of the absorbed energy quanta. The exciton may also be transmitted between different molecules, by interchain transfer. This transmission may occur by any means, for example, transmission through the release of a photon from one molecule and the absorbance of that photon by another molecule or the same molecule, transmission through the transfer of kinetic energy, transmission due to the overlap of pi-orbitals between the different molecules commonly called Dexter or resonant energy transfer mechanisms, or longer range energy transport through a dipolar mechanism called Förster energy transfer. Pi-backbone structures may be used, for example in solutions or in thin films, to amplify the sensitivity of the polymer to external compounds.

In one set of embodiments, the polymer molecules of an aggregate composition may be arranged in an electronically-communicative manner, such that excitons may be delocalized over more than one polymer in such a way as to enhance interchain pathways, for example, without excessive quenching from an activation site to an emission site. In one embodiment, the polymer molecules are arranged in an electronically-communicative manner providing a fluorescence quantum yield for the aggregate at least 0.05 times that of the individual quantum yields of the polymer molecules, preferably at least 0.30 times that of that of the individual quantum yields of the polymer molecules, more preferably at least 0.45 times that of the individual quantum yields of the polymer molecules, still more preferably at least 0.60 times that of the individual quantum yields of the polymer molecules, and still more preferably at least 0.75 times or higher than that of the individual quantum yields of the polymer molecules. In some embodiments, the polymer molecules may have fluorescence quantum yields of at least 1%, preferably at least 2%, more preferably at least 3%, and more preferably still at least 5%, 10%, 20%, 25% or more.

The polymers of the invention may be aggregated into a formation that allows the polymers to remain fluorescent and conductive. Aggregation may increase the electronic interactions between nearby polymer molecules, which may result in a decrease in the quantum yield, or a red shift in the absorption spectrum (for example, as quantified in an absorption maximum). In one embodiment, the aggregate composition may have an absorption spectrum having a unique, red-shifted absorption relative to an absorption spectrum of a random dispersion of the polymer molecules. In another embodiment, the aggregate composition may have a fluorescence quantum yield at least 0.02 times, 0.05 times, 0.1 times, 0.2 times, 0.3 times, or higher than that of the individual quantum yields of the polymer molecules.

Figure 8A:
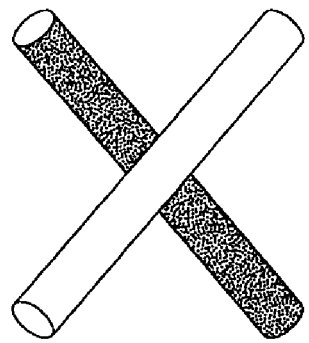
FIG. 8A–FIG. 8B are schematic illustrations of configurational chirality.
Figure 8B:
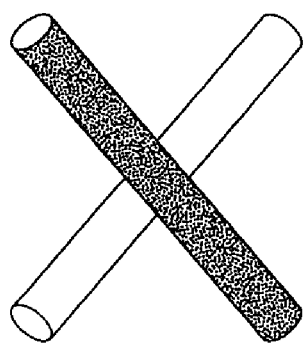

In one set of embodiments, two or more non-aligned polymer molecules within the aggregate are oriented at an angle to each other, for example, as illustrated in FIG. 8. Two or more molecules oriented in this fashion may exhibit "configurational chirality," as illustrated in FIGS. 8a and 8b, although the molecules themselves may be chiral or nonchiral. For example, the molecules may be orientated at any non-zero angle relative to each other, for example, at angle of 10 degrees, 15 degrees, 45 degrees, 60 degrees, or 80 degrees relative to each other. Other intermediate angles are also possible. The resultant aggregation, as a whole, is chiral in that it can not be superimposed on its mirror image. Thus, "chirality," as used herein, refers not only to an asymmetric molecule (as the term is most commonly used in the field of chemistry), but also refers to the chirality of an aggregation of molecules. Where the concepts are to be distinguished, the terms "molecular chirality" and "configurational chirality" are used to distinguish chiral molecules from chiral assemblies of molecules, respectively. Thus, in one embodiment, the invention involves molecularly chiral molecules, arranged within an aggregation that may be configurationally chiral or nonchiral; in another embodiment, the invention involves nonchiral molecules arranged in a configurationally chiral aggregation.

Figure 11A:
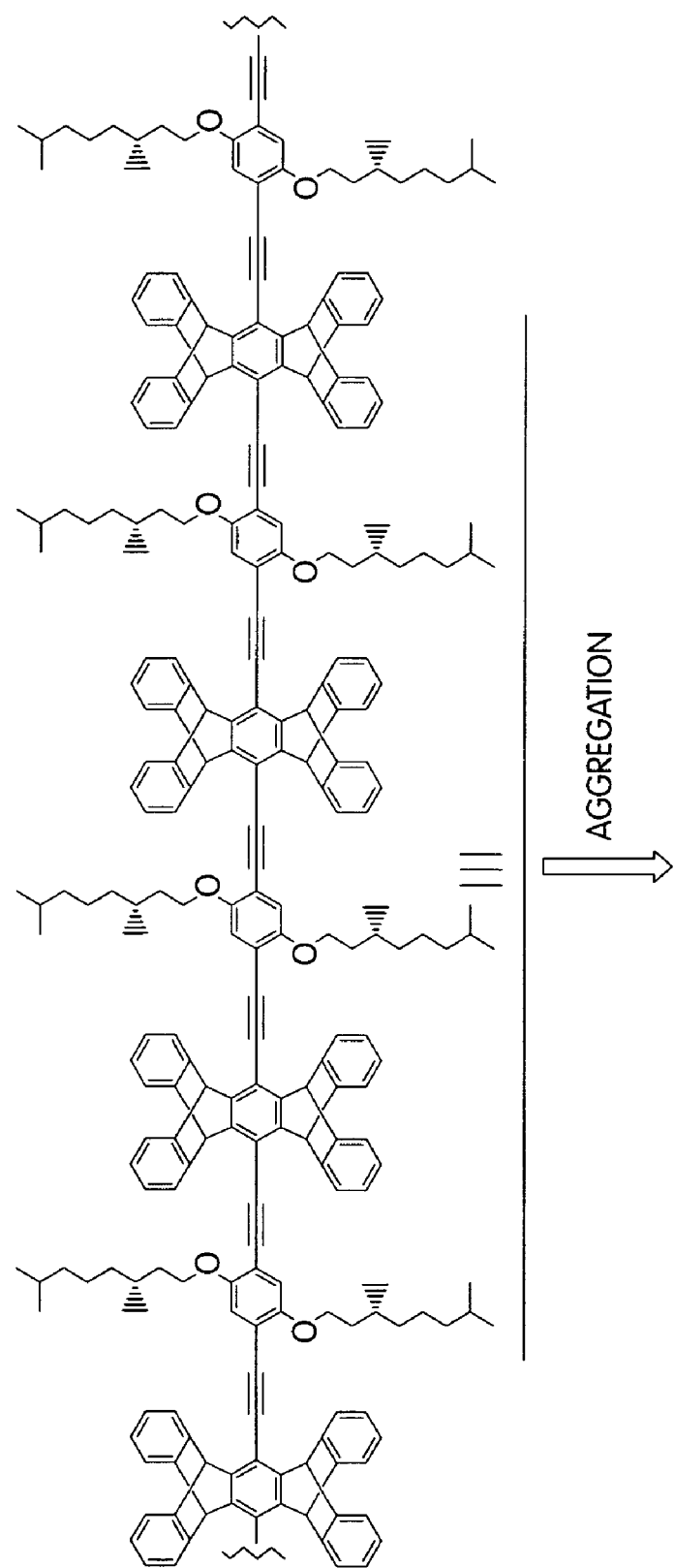
FIG. 11A–FIG. 11B are schematic diagrams illustrating the aggregation behavior of a specific polymer molecule.
Figure 11B:
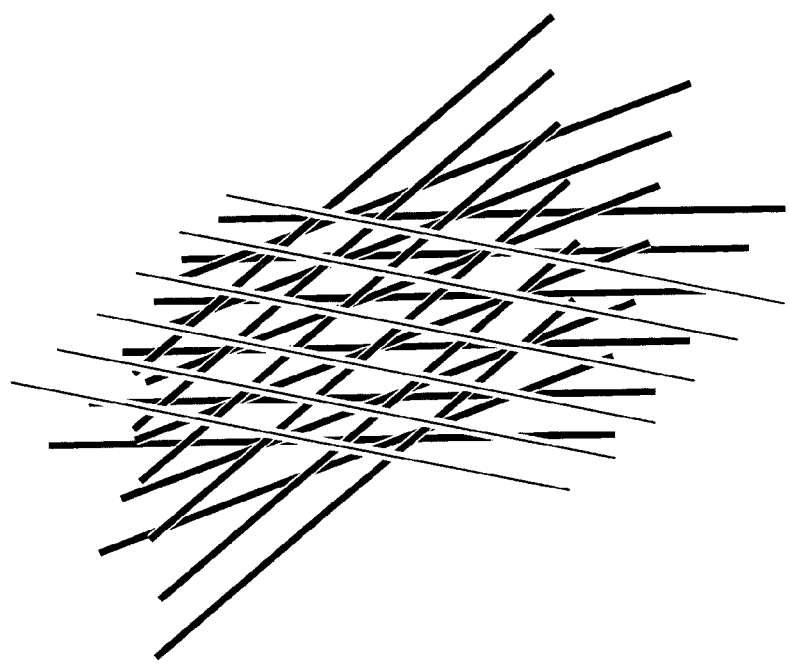

Certain embodiments of the invention include chiral aggregations of molecules (i.e., an aggregation exhibiting molecular chirality, configurational chirality, or both forms of chirality). For example, in a series of non-aligned polymer molecules, each oriented at fixed angles relative to each other as shown in FIG. 2B, the series of polymer molecules may exhibit a helical structure or a helical grid structure. For example, in one particular embodiment, a series of molecules, each oriented at the same angle relative to adjacent molecules, may have a chiral structure or a "twist" in the orientation. Although the molecules themselves may or may not be chiral, the resulting structure may exhibit configurational chirality, for example, as a left-handed or a right-handed spiral or matrix (see, for example, FIG. 11B). Of course, in other embodiments of the invention, the non-aligned polymer molecules might not be oriented at fixed angles relative to each other, but might exhibit a range of different angles, such that the molecules are substantially non-aligned (of course, in a sufficiently large aggregation of molecules, a small percentage of molecules will be aligned due to chance). In certain embodiments, the chiral aggregate may produce polarized light, which may be used, for example, to enhance brightness in a liquid crystal display. The light may in some cases be polarized, for example, linearly or circularly polarized.

The polymer molecules within the aggregation may be stabilized, in accordance with the invention, by any suitable means, such as through chemical means (i.e., bonding of the polymer molecules to each other, or to intermediate agents), or physical means (e.g., through steric interactions or physical processes, especially where molecules are chosen that possess appropriate physical structure). Preferably, the polymer molecules are stabilized in configurations, for example, as previously described in reference to FIG. 2B, such that the polymer molecules are close enough to allow interchain electronic interactions to occur between nearby polymer molecules, while remaining non-aligned.

In one set of embodiments, polymer molecules are chemically or physically immobilized relative to each other, within the aggregate, via a very rapid reaction. For example, the reaction may be a polymerization reaction, a condensation reaction, hydrogen bonding, Diels-Alder cycloaddition, protein-protein interaction, interactions between oligo-or polymeric-nucleotides, electrostatic attractions, metal ligand interactions, and/or ligand receptor interactions. The reaction can optionally be externally initiated, for example, through the use of light (i.e., photons), or a change in heat or kinetic energy. In certain embodiments, immobilization of the polymer molecules occurs while the polymer molecules are in the process of aggregating, thus preserving the structure of the aggregation in an intermediate state (e.g., as illustrated in FIG. 2B). This can be accomplished by measuring the emissive and, optionally, conductive properties of the aggregate during the aggregation process, and "freezing" the aggregate in place when properties are optimized.

In one set of embodiments, the polymers within the aggregate are immobilized through the use of chemical interactions. For example, the polymers may be immobilized in position by direct bonding of the polymer chains to each other, or by bonding the polymer chains to intermediate agents, such that the chains are substantially immobilized or fixed with respect to each other. As used herein, "bonding" refers to any type of chemical bond, for example, covalent bonding, ionic bonding, hydrogen bonding, van der Waals bonding, metal ligand bonding, dative bonding, hydrophobic interactions, and the like. The bonding interaction may occur spontaneously, or be externally directed, for example, through the application of light or a catalyst.

In one embodiment, the polymer molecules are directly bonded to each other. Any suitable chemical bond may be used to join the polymer molecules. For example, in certain embodiments, the polymer molecules may be joined via a free radical polymerization reaction, a metathesis reaction, a 2+2 photocycloaddition reaction, a Diels-Alder cycloaddition reaction, an epoxide ring opening reaction, a condensation reaction, hydrogen bonding, a Diels-Alder cycloaddition reaction, a protein-protein interaction, interactions between nucleotides (for example, oligonucleotides or polynucleotides), an electrostatic interaction, a metal-ligand interaction, a ligand receptor-interaction, self-complementary molecular recognition, and the like. In one embodiment, the polymer molecules are connected in more than one location, such that the resulting polymer molecules may have a crosslinked network structure.

In another embodiment, the polymer molecules are immobilized through ionic or charge effects. For example, interactions between positive or negative charge groups located on or near the polymer molecule (e.g., on side groups extending from the polymer backbone, or on ions associated with the polymer) may interact with other charge groups, such as other polymer molecules or ions within the aggregation, to immobilize the polymer molecules.

The polymer molecules, in another embodiment, are immobilized relative to each other through the use of intermediate or "linking" agents. Bonding of the polymer molecules to the linking agent can cause the polymer molecules to be immobilized relative to each other. The linking agent may be present during the initial formation of the polymer aggregate, then be bonded to one or both polymer molecules at a certain time or under a specified condition, or the linking agent may be added, for example, after aggregation of the polymers has occurred. The reaction may be performed, for example, to enable the resulting aggregation to form an aggregation as previously described. The linking agent may be any agent able to immobilize the polymer molecules relative to each other, for example, a hydrocarbon, an ion, a biological molecule, or the like.

In another set of embodiments, the polymers are immobilized relative to each other through the use of physical interactions, such as physical or phase changes, or steric interactions. The polymer molecules may not have any direct bonding to each other (other than incidental molecular interactions, for example, due to thermal vibration or transient interactions), but interact primarily through physical means. For example, the aggregation may be stabilized upon a phase change such as a glass transition or a solid-solid phase change that alters molecular mobility. As another example, the polymer molecules of the aggregation may interact through steric effects. For example, the polymer molecules may have a geometry and a shape such that motion of the molecule is not possible without the molecule contacting other polymer molecules. In one embodiment, the molecule may have a "zigzag" or an interlocking shape, or there may be rigid side groups attached to the backbone of the polymer, for example, above and below the backbone plane of atoms of the polymer. As one example, in one set of embodiments, the adjacent polymer molecules may have side groups that "interlock" with each other, preventing movement; the side groups of one polymer molecule may fit in "spaces" between the side groups of an adjacent polymer molecule, preventing movement from occurring. Any rigid or shape-persistent moiety may be used, and the rigid or shape-persistent moiety may be attached as a side group to the polymer backbone, or be incorporated within the polymer backbone. As used herein, molecular "motion" or molecular "mobility" generally refers to the bulk motion of polymers relative to each other, and does not refer to the vibrational or enthalpic motion of the atoms comprising the polymer (i.e., background thermal or kinetic energy that is measured as the temperature). In some embodiments, the angles between the polymer molecules are substantially constant. In certain embodiments, the polymer molecules are immobilized within the aggregate such that the polymer molecules are "rigid," for example, such that the angles between the polymer molecules do not substantially change over time.

In another embodiment two or more polymer chains may assemble into super-helix bundles in which the polymer chains form networks. These networks may be crosslinked to fix them in place, or they may be inherently robust enough to persist indefinitely.

In one embodiment, a polymer molecule associated with certain embodiments of the invention can be a substantially rigid molecule (i.e., the polymer molecule, or a portion thereof, such as a side group or the backbone, has a substantially rigid structure). A rigid molecule may stabilize the aggregate, for example, by preventing mobility of the molecules within the aggregate, or by preventing side groups located on the polymer molecule from moving with respect to the polymer molecule or nearby molecules. In some cases, rigid molecules may be connected to other molecules via single bonds; the rigidity of the molecules may sufficiently prevent motion, thus ensuring stability of the aggregate.

The persistence or persistence length of a polymer molecule, as used herein, is a measure of the length over which a polymer points in the same direction as its first bond, and may be used to quantify the overall rigidity of the molecule or a portion thereof. The persistence may be, for example, greater than about 10 nm, preferably greater than about 15 nm, and more preferably greater than about 20 nm, 25 nm, or longer. Similarly, the radius of gyration may also be used as a measure of the rigidity of a molecule. The radius of gyration may be defined in terms of the distribution of distances (in any direction) of each monomer in the molecule from the center of gravity of the molecule. In one set of embodiments, the polymer molecules may have a structure (e.g., a charge or a particular side group) that prevents or resists aggregation of the polymer molecules into an aligned structure.

In one set of embodiments, the polymers may include shape-persistent molecules or moieties. A "shape-persistent molecule," as used herein, is a molecule with a significant amount of rigid structure, as is understood by those of ordinary skill in the art. In one embodiment, in a shape-persistent molecule, polycyclic ring structures may be interconnected at multiple locations, such that no ring is able to move or rotate, relative to other portions of the molecule. In another embodiment, in a shape-persistent molecule, no portion of the molecule having a combined molecular weight of at least 15 g/mol may move relative to other portions of the molecule via rotation about a single bond. In other embodiments of shape-persistent molecules, no portion of the molecule having a molecular weight of greater than 25, 50, or 100 g/mol can move relative to other portions of the molecule via rotation about a single bond. Rigid structures may be provided, for example, by aromatic rings, cyclic structures, cyclic aromatic structures, and the like. For example, in FIG. 9A, triptycene 90 is shape-persistent, with a high degree of internal-free volume. As a comparative example, a molecule including a cyclic structure such as a benzene ring connected to another portion of the molecule via only a single bond, has at least a portion of the molecule that is not shape-persistent according to the embodiment in which the shape-persistent molecule would not allow for rotation about the substitutent. Other example shape-persistent molecules may be found in, for example, U.S. patent application Ser. No. 2002/0150697, and commonly owned U.S. patent application Ser. No. 09/305,379, filed May 5, 1999, both incorporated herein by reference.

Figure 9A:
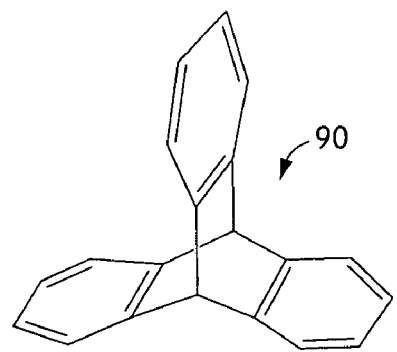
FIG. 9A–FIG. 9B illustrate certain molecules in reference to certain shape-persistent molecules according to certain embodiments of the invention.

Many of the structures of the invention, and used in techniques of the invention, may belong to the class of polymers and molecules built up from iptycenes, such as structure 90 in FIG. 9A. Iptycenes and like molecules have previously been reported in, for example, Hart, "Iptycenes, Cuppendophanes and Cappedophanes," *Pure and Applied Chemistry*, 65(1):27–34 (1993); or Shahlia et al., "Synthesis of Supertriptycene and Two Related Iptycenes," *Journal of Organic Chemistry*, 56:6905–6912 (1991). For example, triptycene 90 shown in FIG. 9A is 9,10-[1',2'-benzeno]-9, 10-dihydroanthracene. Iptycenes are a class of compounds based on this base triptycene structure, where the prefix indicates the number of separated arene planes. Examples of iptycenes include triptycenes (3 planes) and pentiptycenes (5 planes). The arene planes are fused together at the [2.2.2] bicyclooctane junctions. The arene planes are not limited to benzene rings; they may be any polycyclic aromatic structure. In some cases, one or more halogen atoms may also be substituted on the iptycene structure.

Various embodiments of the invention involve use of molecules comprising an iptycene, such as a triptycene. It is to be understood that structures comprising an iptycene can include oligomers, polymers, and monomers. Polymers or oligomers comprising an iptycene can include those having a non-iptycene backbone with iptycene pendent groups or those having iptycenes that form part of the backbone. As an example of the latter class, a polymer can be made up of monomer iptycene building blocks that together form a ladder polymer.

Shape-persistent molecules may be considered to have a length, width, and thickness. These dimensions may be considered to span an imaginary box in which the molecule, as defined by its van der Waals volume, may rest. The molecule may be positioned within the box, in relation to a set of x, y, and z axes, such that the shortest axis in the arrangement defines the molecule's thickness. The minimum thickness of a planar shape-persistent molecule may be defined as the distance between the portions of the molecule located above and below a plane within which the molecule can be defined (or which can be contained completely within the molecule), for example a plane defined by the carbon nuclei of benzene ring. For example, in a benzene ring, the van der Waals radii for the carbon atoms is about ±0.19 nm. A second example is a molecule such as [2.2.2]bicyclooctane, where the thickness of the molecule would be measured from the van der Waals contacts of the outer hydrogen atoms, about 0.554 nm.

Figure 9B:
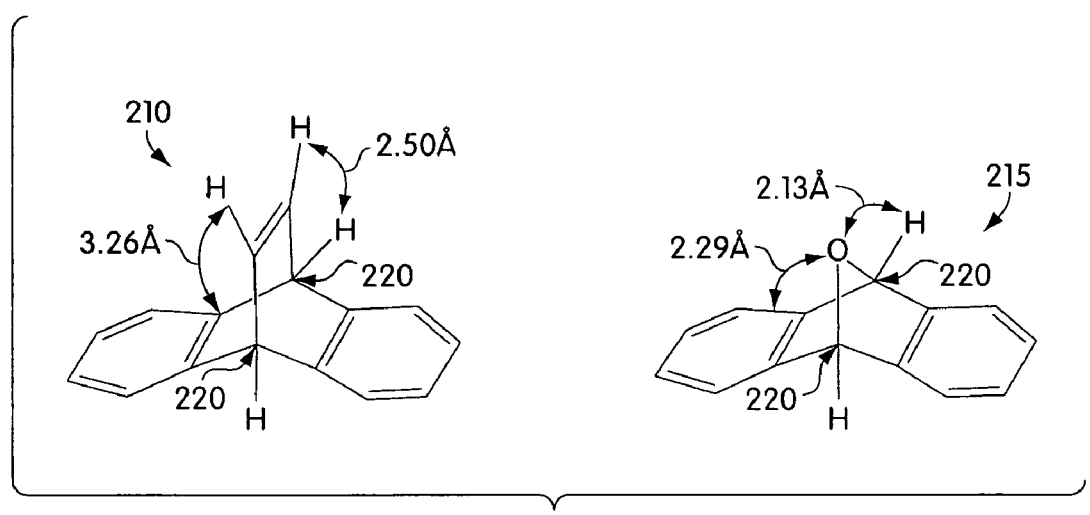

The polymer molecules utilized according to certain embodiments of the invention may have a minimum height or length that is able to prevent motion within the aggregation, due to their rigidity or structure. The minimum height or length of the molecule may be due to the backbone or a side group. In one set of embodiments of the invention, the polymer molecules have a minimum height or length of approximately 0.6214 nm, a value based on the distance between the van der Waals contacts of the 1 and 4 hydrogen atoms of a benzene ring. In one set of embodiments, polymer molecules of the invention include bridgehead atoms and the minimum distance that a molecule may extend in height or length from a bridgehead is 0.35 nm. In other embodiments, the minimum distance that a molecule may extend in height or length from a bridgehead is 0.40 nm, 0.45 nm, 0.50 nm, 0.55 nm, 0.60 nm, or 0.62 nm. Each bridgehead may be any suitable atom, for example, a carbon or a nitrogen atom. By way of illustration, molecules 210 and 215 in FIG. 9B would not meet the requirement of a height or length of approximately 0.6214 nm. Molecule 210 has a height of about 0.326 nm, as measured from the plane of the benzene ring to the uppermost hydrogen atoms, or a height of about 0.250 nm, as measured from the hydrogen atom attached to bridgehead 220. Molecule 215 has a height of about 0.229 nm, as measured from the plane of the benzene ring to the oxygen atom, or a height of about 0.213 nm, as measured from the hydrogen atom attached to bridgehead 220. In some embodiments, the length of the molecule may be at least twice the height of the molecule. The longer dimension may lie on a two-dimensional plane normal to that height. Other three-dimensional structures may also be built up from these two-dimensional structures.

In one set of embodiments, "bulky" groups may be used to prevent molecular motion. In some embodiments, the bulky group may have a smallest dimension of no less than about 0.25 nm. In other embodiments, the smallest dimension can be no less than about 0.30 nm, 0.35 nm, 0.40 nm, 0.45 nm, 0.50 nm, or 0.60 nm. The bulky groups can be located anywhere within the polymer. For example, the bulky groups may be adjacent to or be part of the backbone of the polymer. The bulky groups may also be attached to the polymer chain through the use of pendant groups connected to the backbone of the polymer, or be randomly distributed within the polymer. In some cases, the bulky groups can include delocalized pi-orbital structures, such as double bonds, triple bonds, benzene moieties, anthracenes, pyridines, carbazoles, or the like. In certain embodiments, the bulky groups consist of several benzene rings, interlocking in a bicyclic or a tricyclic structure, for example, as in a triptycene, a pentiptycene, or a propallane moiety. The iptycene moiety and related molecular structures generally have a [2.2.2]bicyclic ring system, formed from the intersection of geometric planes, for example, as defined by aromatic rings fused with the [2.2.2]bicyclic ring system ("arene planes"). The aromatic rings on each of the branches of the [2.2.2]bicyclic ring system, may be connected to, for example, another [2.2.2]bicyclic ring system, or another structure.

Figure 2F:
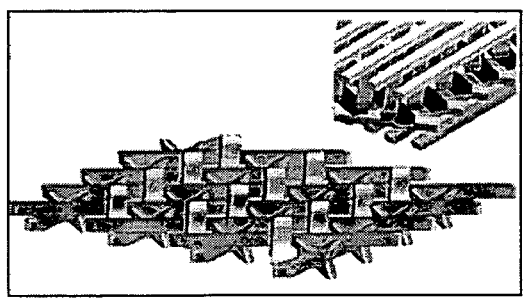
Figure 3A:
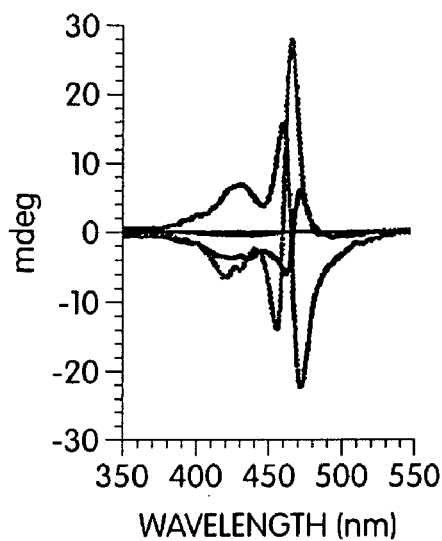
FIG. 3A–FIG. F are plots that illustrate circular dichroism (FIGS. 3A and 3B), absorption (FIGS. 3C and 3D) and fluorescent spectra (FIGS. 3E and 3F) of a polymer according to an embodiment of the invention.
Figure 3B:
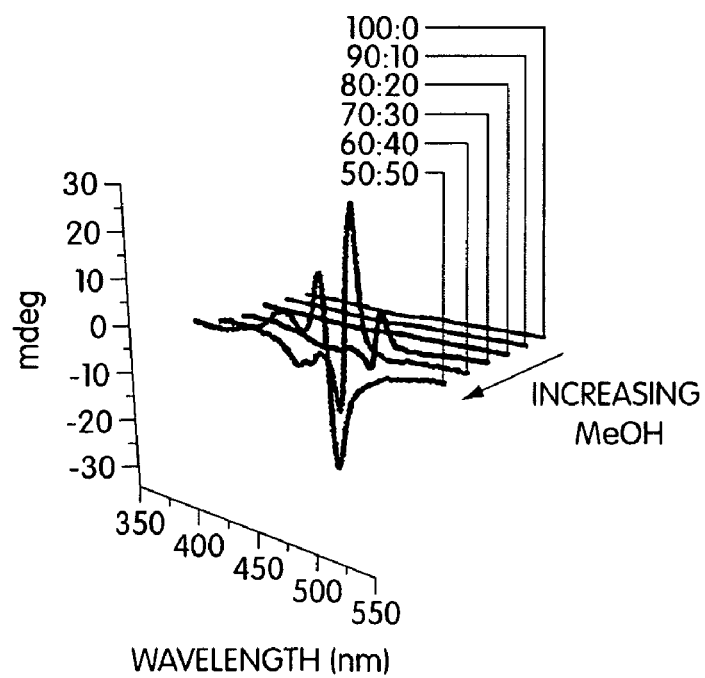
Figure 3C:
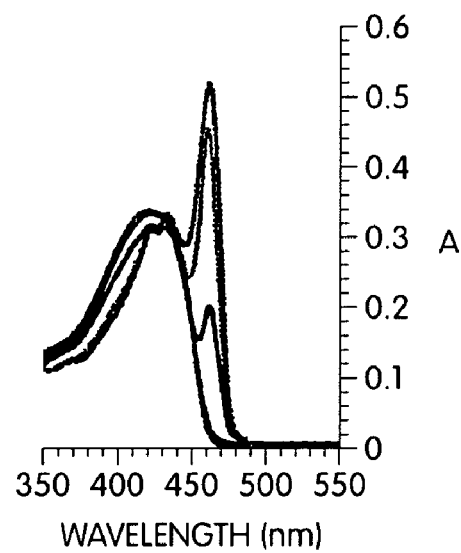
Figure 3D:
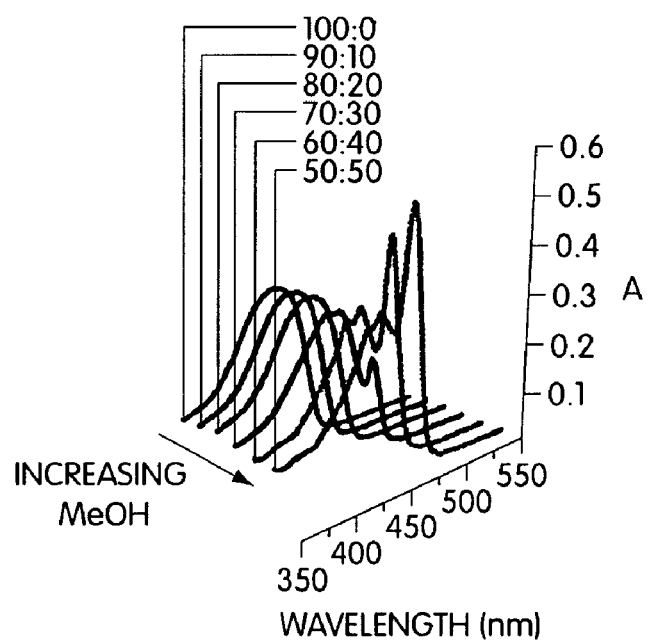
Figure 3E:
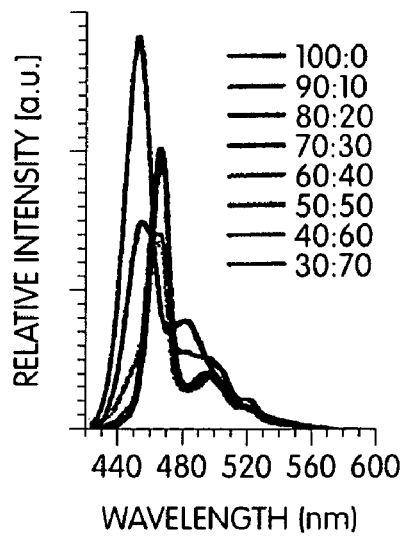
Figure 3F:
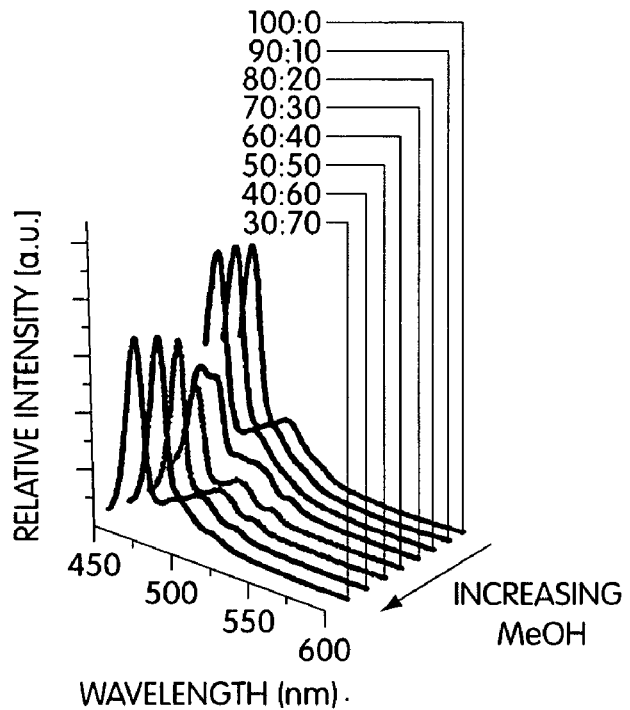

In some embodiments, networks of rigid polymer molecules of the invention may form an interlocking "grid" structure for aggregation stabilization with or without additional chemical bonding between molecules defining the aggregation. The grid may be a rigid grid or a flexible grid, depending on the interactions each polymer molecule has with its neighbors. For example, as illustrated in FIG. 2f, a series of polymer molecules may interlock with each other (for example, chemically or physically) to form a substantially planar array of polymer molecules. Each "plane" of polymer molecules may interact with other substantially planar arrays of polymer molecules to form a 3-dimensional matrix of polymer molecules. As previously mentioned, in some embodiments, the polymer molecules may be non-aligned with respect to each other; for example, the polymer molecules may be oriented at an angle relative to each other. A 3-dimensional matrix of these molecules may thus have a series of planes, each positioned at an angle with each other, as illustrated in FIG. 2f.

In one embodiment, a polymer molecule may comprise a formula:

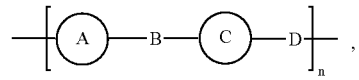

where n is at least 1. At least one of A and C may be a steric or a bulky group that may interlock or sterically interact with nearby molecules and prevent rotation. A and C may be, for example, space-filling, shape-persistent, rigid, or bulky groups. In some cases, at least one of A or C may comprise an aromatic group, or an iptycene group such as a triptycene. B and D can each be of any length, and may include, for example, delocalized pi-orbital structures such as double bonds or triple bonds.

In one set of embodiments of the present invention, compositions of the invention comprising iptycenes are provided that may have average molecular weights greater than 2 kDa, preferably greater than 2.5 kDa, and more preferably greater than 3, 4, 5 or 6 kDa (a "kilodalton" or "kDa" is 1000 g/mol). The materials may be soluble in common solvents, for example, water, chloroform, carbon dioxide, toluene, benzene, hexane, dichloromethane, tetrahydrofuran, ethanol, acetone, or acetonitrile. The materials may be soluble in a least one of the solvents, or at least two or three of any of these solvents. "Soluble" in this context means soluble at greater than 0.5 mg/ml, preferably greater than 1 mg/ml, more preferably greater than 5 mg/ml, and more preferably still greater than 10 mg/ml.

One structural feature of one set of embodiments of certain iptycenes of the invention, is that the [2.2.2]bicyclic ring system forms the intersections of planes defined by aromatic rings.

Another class of molecules of certain embodiments of the invention are those molecules that include a [2.2.2]bicyclic ring system, with each branch of the system connecting to cyclic aromatics. Each of the bridgeheads in these molecules may be connected to three cyclic aromatics, and at least one of the cyclic aromatics may be connected to another [2.2.2] bridgehead-pair of center, or may be fused to another aromatic system (i.e. shares at least one bond in common with another aromatic system).

In some embodiments, at least two of the cyclic aromatics emanating from the central [2.2.2]system may be fused to another aromatic system or connected to another [2.2.2] center, and in other embodiments, all three cyclic aromatics may be fused to other aromatic systems or connected to a bridgehead center.

Figure 10A:
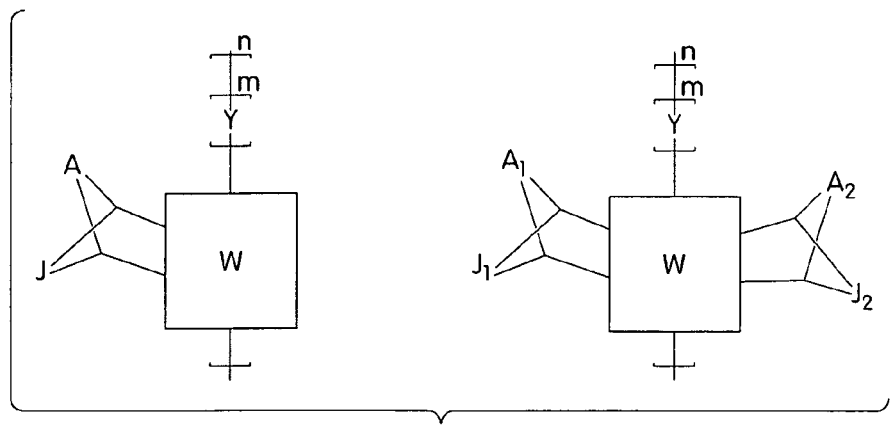
FIG. 10A–FIG. 10C illustrate certain exemplary molecules of certain embodiments of the invention.
Figure 10B:
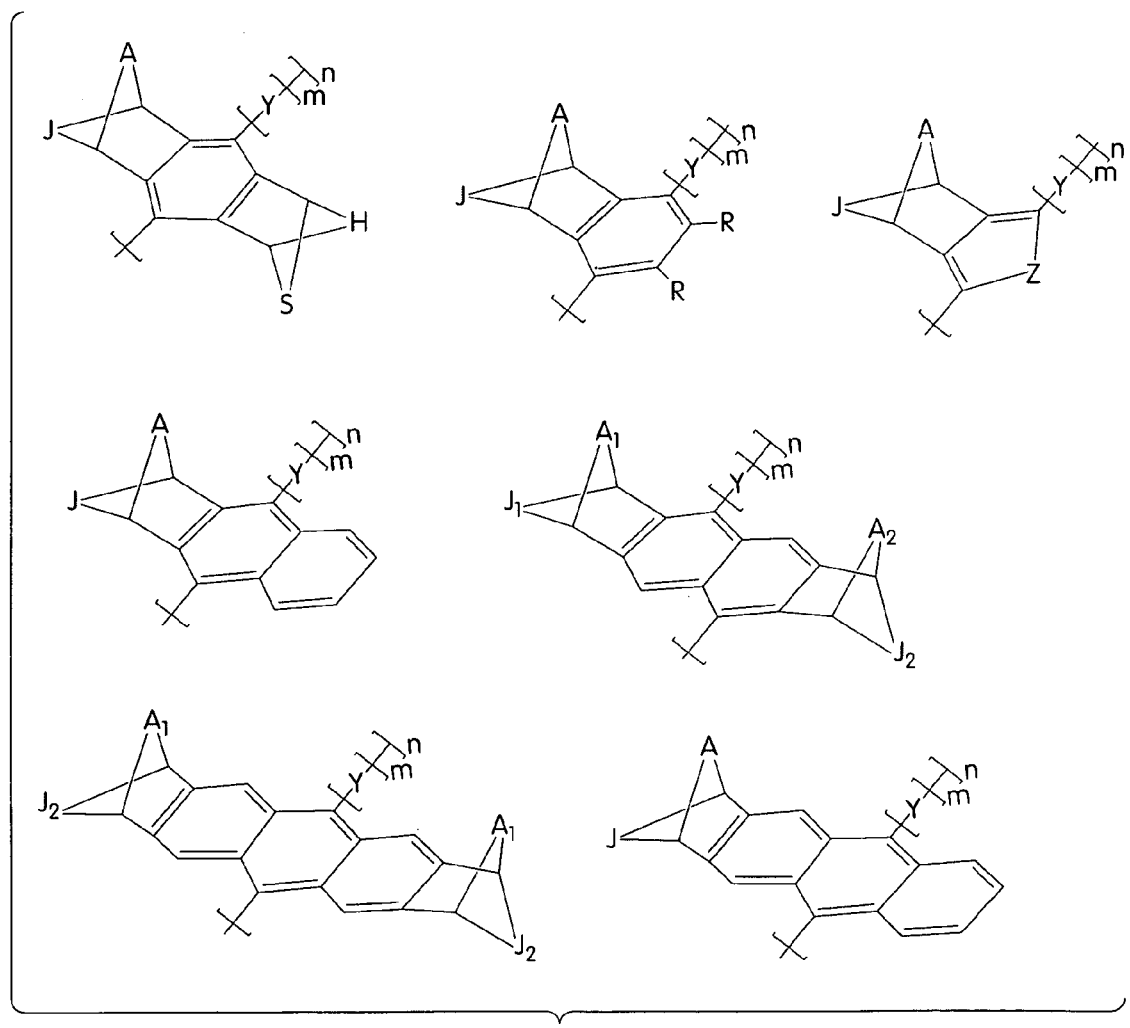
Figure 10C:
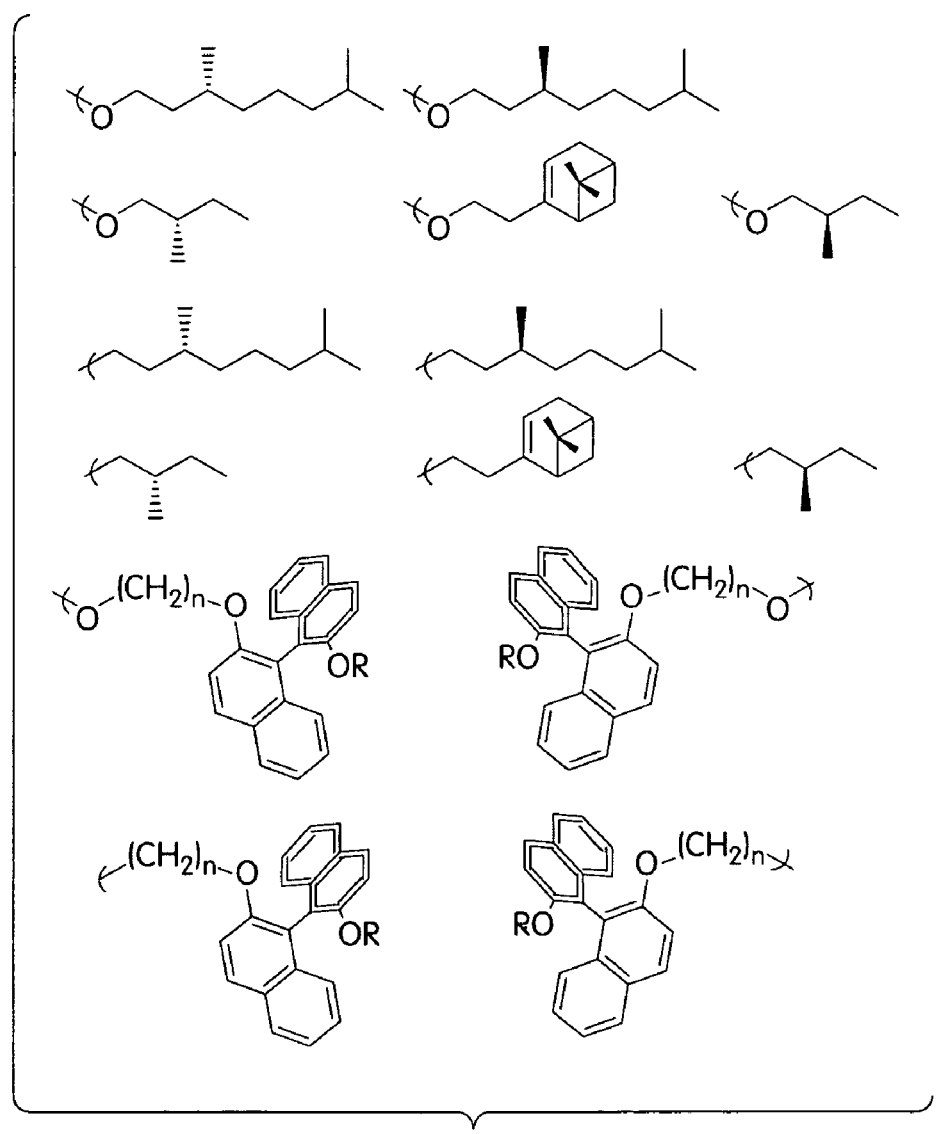
Figure 12:
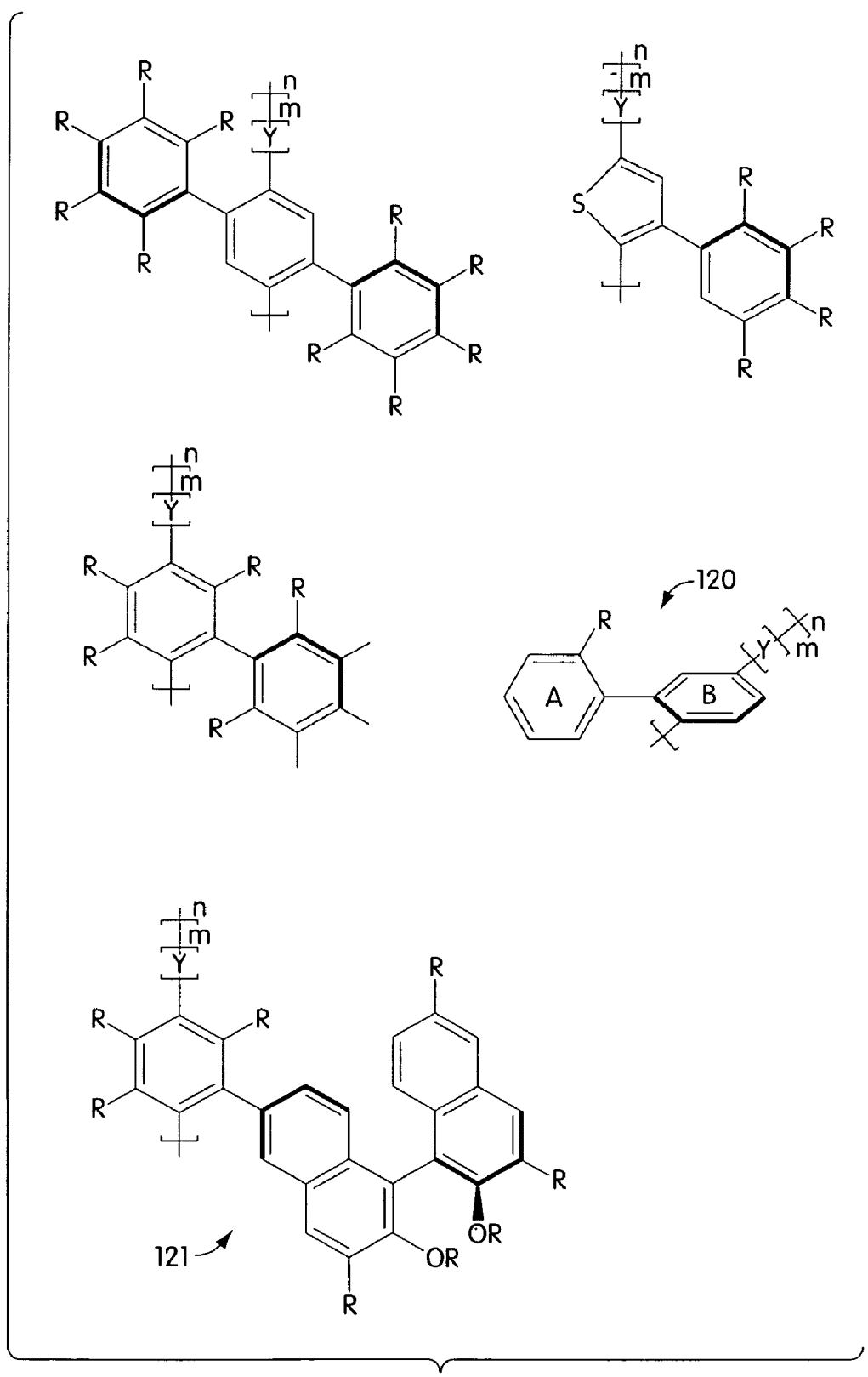
FIG. 12 illustrates certain exemplary molecules of certain embodiments of the invention.

Additional structures of the polymer molecules of certain embodiments of the invention are illustrated in FIGS. 10 and 12. In one embodiment, polymers may comprise monomers having one or more bicyclic ring systems (e.g., a [2.2.2] bicyclic ring system, a [2.2.3], a [2.1.1], a [2.2.1] system, or the like), which may be unsubstituted or substituted in some cases. The bicyclic ring systems may further include olefins, aliphatic or aromatic groups, heterocyclic compounds, or the like. As one example, FIG. 10A shows certain polymer structures, where W represents an olefin, an aromatic group, a heterocyclic compound, an unsaturated cyclic compound, or the like; Y represents an olefin, acetylene, or an aromatic group; A and J independently represent $CH_2$, $CR_2$, $CH_2$—$CH_2$, O, NR, an aromatic group, or an alkene ($A_1/A_2$ and $J_1/J_2$ are also independently selected); R represents any organic fragment or hydrogen; and n and m are integers representing the number of monomer or submonomer units, respectively, that may be independently selected. Any of these groups may be chiral or non-chiral moieties. Examples of the compounds described in FIG. 10A are illustrated in 10B. In these figures, Z represents O, S, or NR; other abbreviations are the same as in FIG. 10A. As with FIG. 10A, all of these groups may be independently varied, and any of the groups may be chiral. Examples of chiral groups that may be attached to any of the embodiments of the invention (including those of FIGS. 10A and 10B) are illustrated in FIG. 10C. Of course, the chiral groups are not limited to those shown in FIG. 10C; other chiral groups include, by way of example, carbohydrates, oligonucleotides, peptides, or amino acids. As one example, in FIG. 12, structure 120 has a steric interaction between groups A and B (for example, between R on ring A and ring B), causing the monomer to adopt a nonplanar configuration.

In one set of embodiments, the polymer may include formulas such as, for example $[W]_n$, $[AW]_n$, or $[AWB]_n$, where A and/or B represent bicyclic moieties, W represents a cyclic moiety or a substituted cyclic moiety (comprising any number of molecules in a ring, for example a ring of 5 or 6 atoms), and A and W, and, optionally, B and W, are fused. In certain embodiments, W represents a substituted benzene, or a heterocyclic ring such as thiophene ring.

The substituents may be any substituent able to maintain the bicyclic nature of the ring system, and, in certain cases, able to maintain the rigidity or the conductivity of the polymer. The substituents on the cyclic compound may be any suitable substituent. The substituents may be located anywhere within the ring systems, and may include, for example, hydrocarbons (including alipahatic or cyclic hydrocarbons), substituted hydrocarbons (e.g., with halogens, nitrogens, oxygens, etc.), or the like. Examples of substituents include O, NR, S, an aromatic group, an alkene (e.g., CR=CR), $CR_2$, $CR_2$—$CR_2$, or the like. (As used herein, R represents a generic substituent, as understood by those of ordinary skill in the art. R may include, for example, hydrocarbons, nitrogen compounds, halogens, oxygenated compounds, hydrogen atoms, or the like.)

Rigid aromatic groups attached though a single bond to the polymer backbone may be used to create aggregates having non-aligned backbones. As shown in FIG. 12, an R group placed on aromatic ring A on structure 120 in such a way as to create steric hindrance, for example, by positioning A directly adjacent to the point of connection to aromatic ring B, may be used to create a three dimensional structure having steric interactions that prevent a planar structure.

Three-dimensional chiral groups (for example, as shown in structure 121) may also produce the necessary structural requirement for forming a electronically communicative emissive aggregate. In this case, it may not be necessary to restrict the rotation of the pendant group with respect to the polymer backbone; the rigid shape persistent nature of the pendant group may be sufficient to produce a non-aligned aggregate structure.

As used herein, the term "polymer" is given its ordinary meaning in the art. A polymer is generally composed of one or more monomers or "repeat units," which are chemically bonded together in some fashion. In one set of embodiments, the polymer is constructed to allow extended electronic interactions along the polymer, preferably along the backbone of the polymer. The electronic interactions may allow excitons or electrons to be transmitted along the polymer. For example, the polymer may have double bonds, triple bonds, benzene rings, naphthalene rings, anthracene rings, triphenylenes, thiophenes, fluorenes, pyridines, carbazoles, or other structures that allow excitons or electrons to be transmitted along the polymer. Other systems having similar arrangements of atoms to produce delocalized pi-bonds are also within the scope of the invention, as well as moieties containing delocalized pi structures having additional substituents, such as oxygen, sulfur, silicon, germanium, nitrogen, a halogen, or the like. For example, nitrogen atoms may be substituted for carbon atoms within a delocalized pi structure, such as in pyridines and similar compounds. In one set of embodiments, the polymer is constructed such that electronic interactions extend at least 2 monomer units from their source. In other embodiments, the electronic interactions may extend at least 5 units, at least 10 units, at least 100 units, at least 500 units, at least 1000 units, and, in some cases, throughout the entire backbone of the polymer.

Of course, the polymer is not limited solely to carbon compounds, but also to polymers containing other elements that are able to polymerize, for example, but not limited to, nitrogen, boron, silicon, or germanium. For example, the polymer backbone may consist of only silicon or germanium atoms, or the polymer backbone may include a combination of several elements, for example, carbon and silicon atoms. In some embodiments, the backbone may be conductive; in other embodiments, however, the backbone may be semi-conductive; in yet other embodiments, the polymer may be photoconductive. For example, a spectral comparison of one of the monomer units to the polymer molecule may demonstrate a change in the energy gap between the highest filled molecular or electronic orbital and the lowest unfilled molecular or electronic orbital of the monomer may be greater than about 0.1 eV, greater than about 0.5 eV, or greater than about 1 eV. In some embodiments, the energy gap may be less than about 5 eV, less than about 3 eV, or less than about 2 eV, or less than 1 eV. By choice of the polymer structure the energy gap may be tuned to match the ultra-violet, the visible, and infrared regions of the electromagnetic spectrum.

Any number of monomers may be combined to form the polymer molecule. For example, the polymer may be formed from at least 7 monomers, at least 10 monomers, at least 15 monomers, at least 50 monomers, at least 100 monomers, at least 300 monomers, or more. The resulting polymer molecular may have a molecular weight of at least 7 kDa, at least 12 kDa, at least 20 kDa, at least 60 kDa, or at least 100 kDa or more. Additionally, the polymer molecules may all have similar molecular weights or sizes (i.e., the polymers may have a small polydispersity), or the polymer molecules may vary in size or molecular weight (i.e., a large polydispersity).

In some embodiments, the aggregations of the invention are thermodynamically stable. In particular, the aggregations of the invention are not in a metastable state, for example, which could be altered upon heating or contact with certain solvents such as methanol, or which could relax to form another structure, such as an amorphous arrangement. In the absence of solvent, the aggregates remain unchanged, for example, as indicated by a change in quantum yield of no greater than 5% and a change in wavelength of the unique absorption of no more than 5%. In one embodiment, the aggregate is stable in the absence of solvent at 50° C. for at least a minute in air, preferably at least a day, more preferably at least 30 days, and still more preferably for at least 90 days or even longer. The aggregates may exhibit greater stability at room temperature, for example, being stable for at least about 180 days. The aggregate may also be stable at higher temperatures, for example, at 75° C. or 100° C., for similar periods of time.

More than two polymer molecules may be assembled together to form a stable aggregate in certain cases. The stable aggregation of molecules may thus extend over a 3-dimensional lattice or grid structure. In some embodiments, the aggregation may have a chiral structure.

The aggregation of polymer molecules may produce a different spectra than does a solution e.g., as illustrated in FIG. 2a) or an aligned configuration (e.g., FIG. 2c). The polymer molecules in solution may not have substantially overlapping electronic delocalization, while the aligned polymer molecules may have substantial quenching. In the configurations of the invention that maximize electronic delocalization while minimizing quenching by adjacent molecules, the resulting spectra may exhibit a shift or a change in the spectra, for example, by the appearance of a second peak as seen in FIG. 1. This change in the spectra corresponding to a change in the overall configuration of the polymer molecule (e.g., whether in solution or crystallized) may be due to the difference in the localized environment of the polymer molecule, for example, due to the effects of nearby molecules or ions on the local polymer environment. The spectra in FIG. 1 illustrates circular dichroism, absorption, and fluorescent spectra of a polymer which forms a transient configurationally chiral aggregate; these transient aggregates may be stabilized using methods of the invention, for example, as the spectra in FIG. 3 indicates. The shifts in the spectra are a combination of intramolecular electronic interactions wherein the aggregation produces a more planar conjugated structure and intermolecular interactions wherein the electronic interactions extend between polymer chains.

The aggregates may be prepared in any suitable form. The aggregates may be prepared from a solution, for example, by the addition of a nonsolvent (an example would be to add a highly polar solvent such as methanol to a solution of a non-polar polymer in chloroform), or the removal of a solvent (for example, through lyophilization). In one embodiment, the aggregates may be prepared as a film. In another embodiment, the aggregates may be prepared as a nanoparticle, a structured nanoparticle, a colloidal particle, or the aggregates may remain in a solution or a suspension.

In one embodiment, the invention provides a sensor. As used herein, a "sensor" refers to any device or article capable of detecting an "analyte," i.e. any chemical, biochemical, or biological entity (e.g. a molecule) to be analyzed. The sensor may have high specificity for the analyte. In one embodiment, a binding site for the analyte can be immobilized with respect to the aggregation (e.g. chemically bonded or otherwise linked), and positioned in close enough proximity physically, or within sufficient electronic or inductive communication range, such that interaction of the analyte with the binding site causes a detectable change in the aggregation. The binding site may comprise a biological or a chemical molecule able to bind to another biological or chemical molecule in a medium, e.g. in solution. For example, the binding site may include a chemical receptor able to bind to an explosive molecule such as trinitrotoluene (TNT), such as may be present within a land mine. Reactive functionality may be inserted into the material that can be used to detect the presence of a reactive chemical such as an enzyme or a chemical warfare agent (e.g., a nerve gas). The receptor unit may also be designed to bind to a biological molecule, such as, for example, DNA, proteins, carbohydrates, a virus, a cell, bacteria, anions, cations, or gases. In some cases, the sensors may be used in applications such as drug discovery, the isolation or purification of certain compounds, or high-throughput screening techniques.

In another set of embodiments, the sensor is a chirality sensor. The ability to discriminate between different mirror image isomers (see, for example, FIG. 5) may be used for the detection of the enantiomeric excess of any chiral compound, for example, different amine-containing drugs, or various intermediates. One example of a chirality sensor is as follows. Aggregates having different chiralities (for example, two aggregates having similar molecular arrangements, but opposite chiralities) may be used to bind an analyte, the chirality or "enantiomeric excess" ("ee") of which is to be determined. Differences in the amount of binding of the two enantiomeric analytes to each type of aggregate may be determined, for example, by electronic means, or by the emission of light from each aggregate. These differences may then be used to determine the chirality of the analyte or analyte solution.

In one embodiment, an enantiomeric sensor able to quantify the enantiomeric excess ("ee") of a sample may be made by preparing two polymeric films (or other polymeric entities) having opposite chiralities, utilizing various techniques of the invention. A sample having an unknown ee may be contacted with the sensor. The binding rates between the sample and each of the chiral films may be measured (for example, electrically or optically), and used to calculate the relative binding rates to each film. For example, the binding rates to each film may be determined during competitive inhibition with a quenching agent (as one example, an amine may be readily reacted with 2,4-dinitrofluorobenzene to produce a quenching agent). The differences in binding rates may then be correlated to the ee of the sample. This determination may be performed, in some cases, without requiring a certain specificity of the sample to the sensor, or the separation or isolation of the sample into its enantiomeric components before measurement and quantification.

The invention can also be used in a light-sensitive or light-activated device or sensor, such as a photodetector or a photovoltaic device. Incident light can, for example, interact with a polymer molecule of the invention through a chromophore or an activation site. The exciton produced by such an interaction may then be transmitted, amplified, and/or detected by any suitable means (e.g., through electronic or photonic means), depending on the application. For example, energy may be collected by the activation site in the form of an exciton (e.g., a hole-electron pair), which then migrates to a separation site or a detection site, for example, to store charge or indicate the absorption of a photon. In one embodiment, an exciton in a polymer aggregate may act as an electron donor. Upon diffusion of the exciton to an interface with an acceptor (for example, titanium dioxide, a semiconductor, a polymer/molecular composition capable of accepting an electron, or an electron acceptor in liquid electrolyte), the polymer may transfer an electron to the acceptor, serving as an effective hole transport medium. In another embodiment, the polymer may be an electron acceptor. Upon diffusion of the exciton to an interface with a donor (for example, metal electrode, semiconductor, a polymer/molecular composition capable of donating an electron, or an electron donor in liquid electrolyte), an electron may be transferred to the polymer.

In one embodiment, the invention is used in an organic light-emitting device ("OLED"). In some cases, the OLED may be able to produce polarized light (e.g., circularly polarized light), which may be due to the chirality of the aggregates. The OLED's, in particular embodiments, may comprise one or more stable aggregates of polymers, in contrast to certain other OLED devices where the polymers are generally kept separate. Certain polymer aggregates of the invention may be designed to be excellent conductors of cations (holes) or anions (electrons) or both. The fluorescence efficiency of the aggregates may allow excitons formed by the condensation of electrons and/or holes to produce a bright display in an emitting device. OLEDs comprising polymer aggregates, in certain embodiments, may be used in conjunction with phosphorescent emitters to further improve emission efficiency.

In another set of embodiments, the invention is used in a device having improved conductivity, for example, as in a wire or an electrical device. The device may conduct, for example, electrons or holes.

A series of simple screening tests may be used to determine molecules that are good candidates for success in the present invention. For example, in one set of screening tests, the molecular weight of the polymer molecule should be greater than 7000 g/mol, or the number of monomers should be at least 7. The fluorescence quantum yield of the candidate molecule can also be quantitatively determined; the quantum yield should preferably be at least 2%. In another screening test, the conductivity of the polymer may be determined. Candidate polymers having conductivities that are in the range of conductive or semiconductive materials will be desired. Another set of screening tests involves determining the change in gap between the highest filled molecular or electronic orbital and the lowest unfilled molecular or electronic orbital of the monomer and the resulting polymer. A change of energy of at least about 0.1 eV between the two structures is preferable in certain cases.

In some embodiments, screening tests of the ability of the polymer molecule to aggregate may be conducted by casting a film from the polymer molecule solution. Films that have measurable fluorescence may be good candidates. In certain embodiments, the screening test may be conducted by activating polymerization at predetermined times during the casting process (for example, using photopolymerization chemistries or polymer molecules with various bulky side groups). By stopping aggregation at various times during the casting process, films that have some fluorescence may be observed, which may indicate good candidates for success in the present invention. In certain embodiments, the fluorescence spectra of the resulting film may be obtained and compared to the fluorescence spectra of unaggregated polymer. A differing pattern of absorption, or a red-shift in the absorption spectra, may indicate a good polymer candidate.

In another set of screening tests, the film may be cast and placed in various external environments that may be used to determine the stability of the aggregates. For example, the film may be exposed to air at 50° C. for 1 minute or 1 hour. Other temperatures, such as 60° C. or 80° C., may also be studied. Films that remain reasonably fluorescent after exposure to the external environment for the set time period may indicate good polymer candidates.

The function and advantage of these and other embodiments of the present invention will be more fully understood from the examples below. The following examples are intended to illustrate the benefits of the present invention, but do not exemplify the full scope of the invention.

EXAMPLE 1

Figure 7:
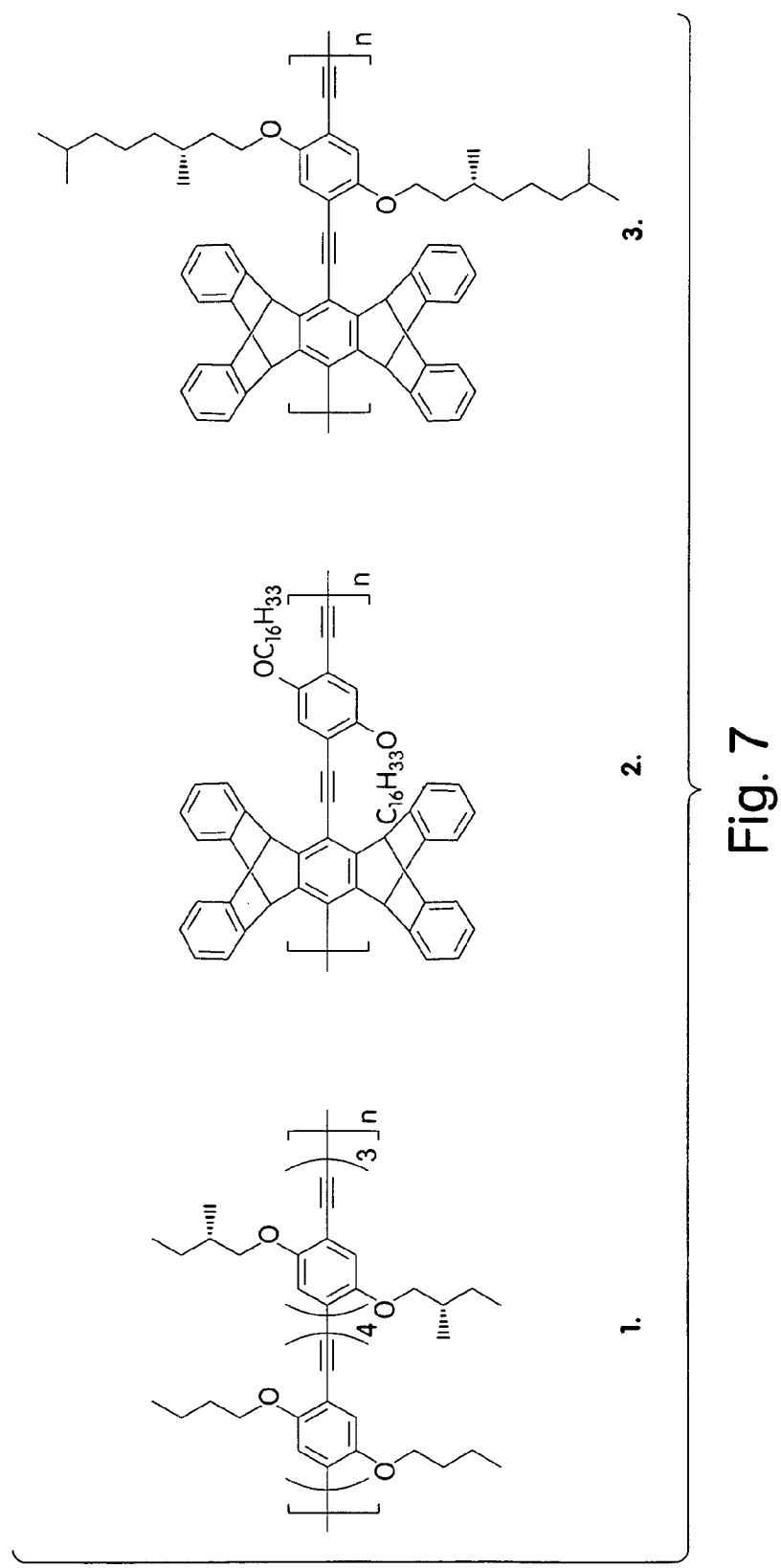
FIG. 7 shows various polymers used in the context of certain embodiments of the invention.

This example illustrates the electronic spectra of para (phenyl-ethynylene)s deduced through studying ordering and phase transitions in Langmuir films that allowed for a deconvolution of the effects of backbone planarization (conjugation length) and interpolymer interactions (aggregation). Structures such as polymer 1 in FIG. 7 were initially investigated to determine their ability to promote aggregation. Structure 1, in this example, contains chiral alkyloxy groups. Other polymers such as poly(2,5-bis[2-(S)-methyl-butoxy]-1,4-phenylene ethynylene) have also been previously investigated.

The addition of non-solvents to a solution of the conjugated polymer generated a stable solution of very small, non-scattering particles that allowed quantitative studies of the optical properties by avoiding the scattering, reflection, and waveguide of the emitted light that can complicate thin film studies. To develop a comprehensive understanding of polymers containing chiral alkyloxy side chains, 58 different compositions shown in FIG. 6 were systematically investigated.

The molecular weight was found to be an important variable. Lower molecular weight materials (e.g., having a $M_n<12,000$) gave different results from higher molecular weight compounds in many instances.

The addition of methanol ($\geq 40\%$) to chloroform solutions containing polymer 1 introduced an aggregate band at 492 nm in the UV-Vis absorption spectrum, as illustrated in FIG. 1 (circular dichroism (A, B), absorption (C, D), and fluorescence spectra (E, F) (2D-view left column, 3D-view right column), recorded in solvent/non-solvent mixtures at 25° C. In these graphs, 100:0 denotes 100 v/v % of chloroform and 0 v/v % of methanol, 20:80 indicates a solvent mixture consisting of 20 v/v % chloroform and 80 v/v % methanol, etc.). The fluorescence thus appeared to be strongly quenched by the aggregate. Commensurate with the appearance of the aggregate band at low methanol concentrations circular dichroism (CD) bands indicative of a chiral structural were also observed. The large CD peak at low methanol concentrations was apparently coincident with the aggregation band which may confirm that the aggregate chromophore was chiral. The other features in the CD spectrum appeared to point to the presence of a second chromophore at higher energy with the same sign in the CD. The inflection point at 454 nm was nearly the same as the absorption maxima of unaggregated and less conjugated segments of the polymer, suggesting an Exciton Coupled CD Mechanism (ECCD). The small negative CD peak at 467 nm in the composite spectrum at low methanol concentrations appeared to be the result of cancellation of the strong positive Second Cotton Effect (C.E.) from the aggregate chromophore and the negative First C.E. from the exciton coupled polymers.

Figure 6:
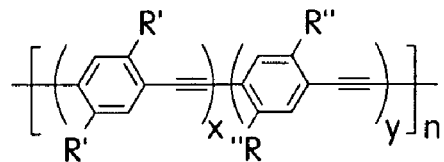
FIG. 6 is a schematic diagram illustrating various polymers used in the context of certain embodiments of the invention.
Figure 6:
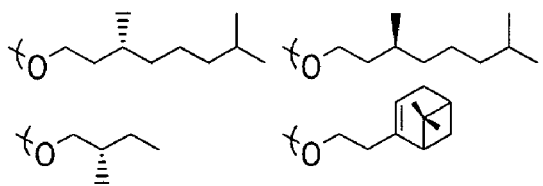
Figure 6:
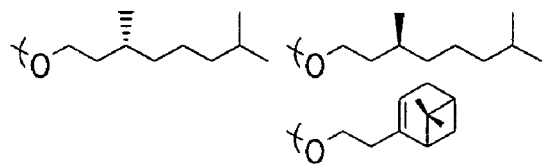

One significant feature of the behavior of polymer 1, as well as related structures illustrated in FIG. 6, was that above methanol concentrations of 50%, the CD decreased rapidly, while the aggregate peak continued to increase (UV-Vis).

This effect may be understood as shown schematically in FIG. 2. Initially, a chiral aggregate forms with a small angle between polymer chains to give an organization reminiscent of a cholesteric liquid crystal. However, the polymer ultimately favors a stronger aggregate structure with coincident alignment of polymer chains, and the helical structure is lost. The resultant organization gives a low or non-existent dihedral angle (CD) between polymer chains, and the fluorescence quantum yields drops to only <5% of its original value ($\Phi=0.04$).

Thus, it was found in this example, that, while structure 1 can form certain chiral aggregates, the aggregates may be further transformed into nonemissive stacked structures (cf. FIGS. 2A–2C).

EXAMPLE 2

This example illustrates specific architectures that prevent aggregate chains from achieving a collinear structure, allowing a strongly aggregated chiral and emissive organization of polymers to be stabilized. Polymers 2 in FIG. 7 containing the pentiptycene group have previously been shown to be excellent in preventing chain aggregation in spin-cast films. However, the addition of methanol (30%) to solutions containing polymers 2 gave aggregates with significantly quenched emission ($\Phi$=0.21). This aggregate is much slower to assemble than polymer 1. The slower assembly may be due to polymer chains assembling into an interlocking structure where the polymer chains are constrained in the clefts between pentiptycene groups.

An interlocking structure, as exhibited by polymer 2, may therefore stabilize chiral aggregates by preventing a coincidence of strongly interacting polymer chains. Studies of chiral analog polymer 3, as described in this example and shown in FIG. 7, confirmed the restricted nature of the aggregated state. Chiral analog 3 is able to form interlocking structures that can stabilize configurationally chiral aggregates. The structure of the CD and absorption spectra was found to evolve slowly over approximately five minutes. Although the absorption spectra display similar behavior to that of polymer 1, with fine structure, the CD spectra were found to be different (FIG. 3). Like polymer 1 in the aggregated state ($\geqq$30% methanol polymer), 3 displayed two dominant contributions that were associated with the aggregate band at a maximum wavelength ($\lambda_{max}$)=460 nm and the unaggregated band at 430 nm. However, there are significant differences between polymers 1 and 3. For example, one major difference is the change in shape and even sign of the CD bands upon forming the tightest aggregate structure in high methanol concentrations ($\geqq$50%). This complication may be the result of the polymer chains being constrained in interlocked irregular structures, as shown in FIG. 2E. The position of the CD band, and the fact that the inflection point is nearly coincident with the maximum wavelength ($\lambda_{max}$) of the aggregate, may indicate an ECCD that only originates from the interpolymer interaction of the planarized chromophores. Hence, it appears that only well-structured or planarized polymer chains were incorporated into the grid. Portions of the material that likely had less ordered and therefore less conjugated electronic structures were not incorporated into the grid-like structure, due to their higher steric demands that made them suitable to fit in the cleft of the polymer. The "solution-like" portions of the material were likely to communicate electronically poorly with each other and therefore gave rise to a broad CD band at 430 nm. FIG. 2 illustrates three stages of aggregation of polymer 1 (left column) and polymer 3 (right column). FIG. 2A and FIG. 2D illustrates polymers 1 and 3 dissolved in neat chloroform. Both polymers are highly solvated and interactions between polymer chains are absent. In FIG. 2B, aggregation of polymer 1 has occurred and the rigid rod PPE's form a lamella structure within each plane. The chiral side chains guide the polymers into a chiral macrostructure. The formation of the optically active macrostructure is guided by the influence of the chiral side chains. In FIG. 2E, polymer 3 aggregates analogously to polymer 1, but due to the presence of bulking groups such as pentiptycenes, a slightly irregular interlocked structure may result. The macrostructure of polymer 3 is shown in a two-layer graphic for reasons of simplification and clarity. In FIG. 2C, the initial chiral macrostructure of polymer 1 has been "untwisted," driven by the desire to maximize pi-pi stacking in the edge-on conformation. The dihedral angle assumes a very small value, affording a very weak dichroic signal and low fluorescence quantum yield. In FIG. 2F, polymer 3 self-assembles into a tighter structure by incorporating the polymer into the clefts of the pentiptycenes. Since the "untwisting" motion observed in polymer 1 is hindered, polymer 3 is able to maintain its optical active structure and its high fluorescence quantum yield. The small inset illustrates the anticipated chiral grid-like structure.

The CD signal and the aggregate band in the absorption spectrum were both consistent with interpolymer electronic interactions. However, as shown in FIG. 3, polymer 3 maintained the majority of its fluorescence intensity with aggregation ($\Phi$=0.61). Also shown in FIG. 3, are circular dichroism, absorption, and fluorescence spectra (2D-view left column, 3D-view right column) of R-3, recorded in solvent/non-solvent mixtures at 25° C. (100:0 denotes 100 v/v % of chloroform and 0 v/v % of methanol, 20:80 indicates a solvent mixtures consisting of 20 v/v % chloroform and 80 v/v % methanol, etc.) The CD did not diminish at high methanol concentrations, and upon initial aggregation, the intensity was slightly lower than the more highly aggregated form. Control experiments utilizing the enantiomer of polymer 3 yielded UV-Vis and fluorescence spectra of identical shape and intensity, and a CD spectrum that differs only in the signs of the Cotton Effects (data not shown). Furthermore, a solution containing 50% (S)-3 or (R)-3 displayed absorption spectra qualitatively similar to pure solutions of (S)-3 or (R)-3, but no CD signals. Consistent with chirality being a critical element to maintain a high quantum yield, this aggregate maintained a fluorescence intensity ($\Phi$) of only 0.3 that of the solution values. Thus, higher symmetry aggregates present in the 50:50 mixture of enantiomeric polymers were likely responsible for these effects, because the long-range dipole-dipole interactions responsible for the excitonic coupling were extended beyond nearest neighbors.

Thus, in this example, it was shown that, while polymer 2 may form non-chiral aggregates with lower quantum yields, polymer 3 is able to display stable chiral aggregates and high quantum yields when aggregated.

EXAMPLE 3

Figure 4A:
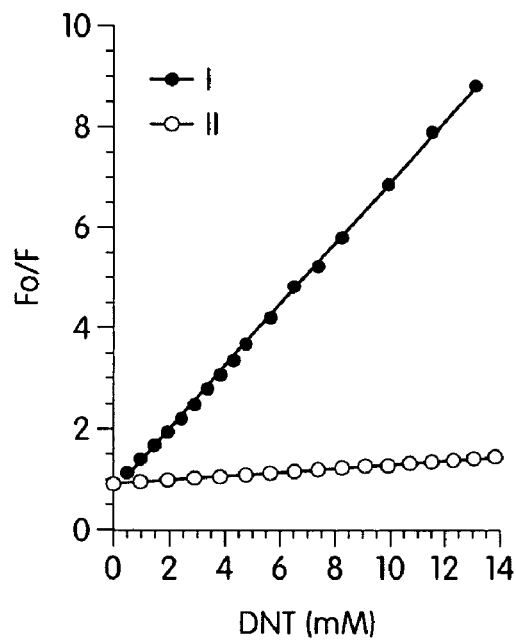
FIG. 4A–FIG. 4B are plots of data from Stern-Volmer experiments performed for a polymer according to an embodiment of the invention.
Figure 4B:
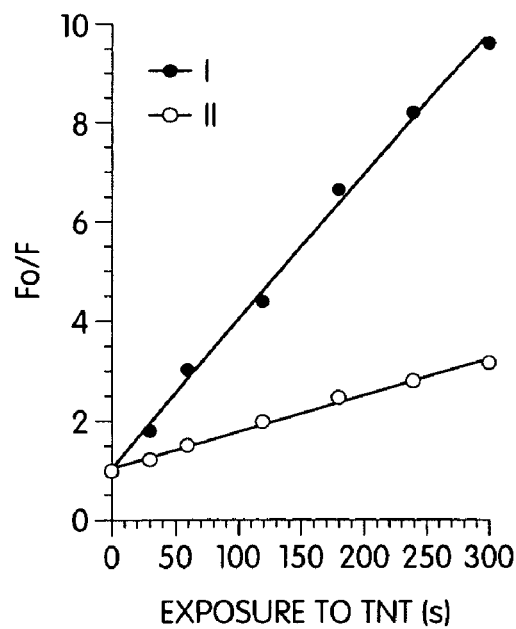

This example illustrates the advantages of a 3-dimensional structure for the design of opto-electric devices. The performance of polymer 3 as a self-amplifying sensory polymer was investigated under solution and solid state conditions by means of Stern-Volmer quenching experiments (FIG. 4, including non-aggregated (II) and aggregated forms (I), in solutions at (a) Optical Density (OD)=0.09 and (b) in films of OD=0.03). In solution, fully aggregated structures of 3 displayed a 15-fold steeper quenching slope toward explosives dinitrotoluene (DNT) and trinitrotoluene (TNT) than non-aggregated forms of polymer 3. In solid-state experiments, polymer 3 was compared to polymer 2, a material with a self-amplified sensory due to efficient transport that may enable sensors to be constructed with femtogram detection capabilities. Polymer 2 exhibited its best performance when spin-coated from non-aggregated solutions, giving films of non-interacting chains. Films of polymer 2 were compared with films spin-coated from aggregated solutions of polymer 3 (55:45 chloroform:methanol). Both films were uniform and of identical optical density. Upon exposure to static 5–10 ppb vapors of TNT, polymer 3 displayed a Stern-Volmer plot that was about 4 times steeper than that of polymer 2. Additionally, thin films of polymer 3 (optical density (OD)=0.04) exhibit a quenching response of ~75% in 10 seconds. This observation may be due to the improved diffusion length of excitons in three-dimensionally coupled chiral grids of polymer 2. Recent work has suggested that strong electronic coupling may provide efficient exciton transport, and hence the excitonic coupling may enhance the interchain transport. Furthermore, the highly organized aggregate may extend the conjugations length of the polymer, resulting in an enhancement exciton of transport. Conducting studies as a function of film thickness have ruled out that the sensitivity enhancement is due to a higher partitioning of TNT to polymer 3 as compared to polymer 2. Due to limited exciton transfer between polymer chains, which limited exciton diffusion, polymer 2 displayed a dramatic 45% decrease in sensitivity in thicker films (OD=0.3) relative to thinner films (OD=0.04). In contrast, polymer 3 displayed only a 10% decrease in quenching sensitivity in thick films (OD=0.2) relative to thin films (OD=0.02).

Figure 5:
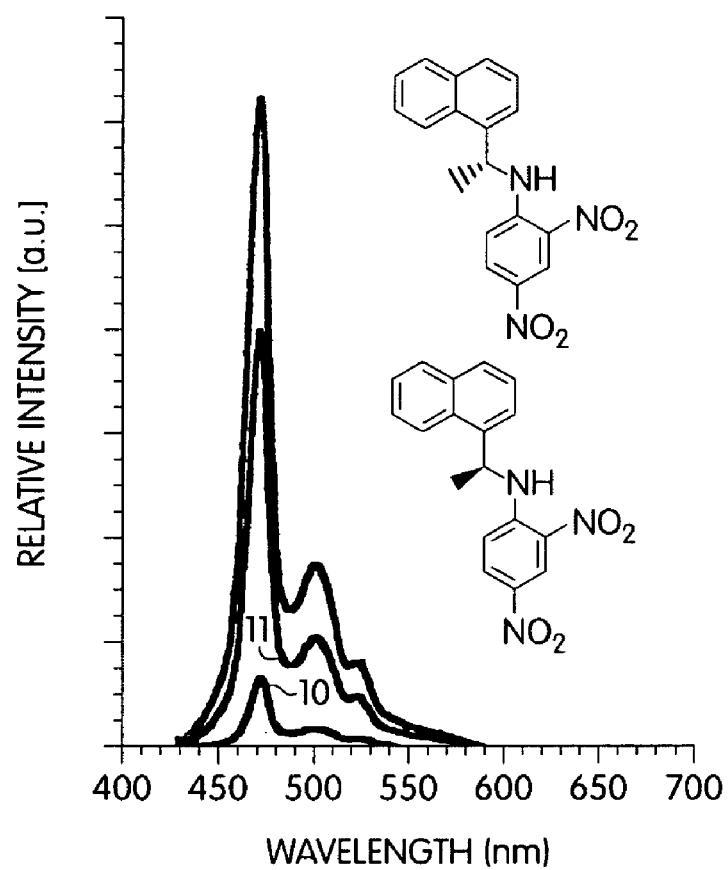
FIG. 5 is a fluorescent spectra of a chiral polymer according to an embodiment of the invention.

Films of (R)-3 also had excellent chiral recognition properties. Exposure to methanolic solutions of (S)- and (R)-(2,4-dinitro-phenyl)-(1-naphthalen-1-yl-ethyl)-amine afforded enantioselective quenching (FIG. 5), where one enantiomer shows selectivity for quenching of one chiral molecule over its enantiomer. Employing (s)-3 gave the opposite result. FIG. 5 shows fluorescence spectra illustrating the impact of (S)- and (R)-(2,4-dinitrophenyl)-(1-naphthalen-1-yl-ethyl)-amine on the fluorescence output of a film of (R)-3. The fluorescence of pristine films of (R)-3 (black line) is quenched more strongly upon exposure to (S)-(2,4-Dinitrophenyl)-(1-naphthalen-1-yl-ethyl)-amine (10) than to (R)-(2,4-Dinitro-phenyl)-(1-naphthalen-1-yl-ethyl)-amine (11).

EXAMPLE 4

This example illustrates an embodiment of the invention as used in an enantiomeric sensor. In this embodiment, a sensor having two enantiomeric polymer aggregates R and S with opposite chiralities is used to determine the enantiomeric excess of compound Q.

Compound Q is exposed to the two enantiomeric plates R and S. If $k_{q1}$ represents the quenching constant of enantiomer of $Q_1$ with polymer aggregate R, and $kq_2$ represents the quenching constant of enantiomer $Q_2$ with polymer aggregate R, then the following equations can be used to determine the enantiomeric excess:

Decrease in fluorescence intensity of aggregate R by enantiomer $Q_1=(k_{q1})$(concentration of $Q_1$)

Decrease in fluorescence intensity of aggregate S by enantiomer $Q_1=(k_{q2})$(concentration of $Q_1$)

Decrease in fluorescence intensity of aggregate R by enantiomer $Q_2=(k_{q2})$(concentration of $Q_1$)

Decrease in fluorescence intensity of aggregate S by enantiomer $Q_2=(k_{q1})$(concentration of $Q_1$)

The difference in the amount of quenching between the enantiomeric polymer aggregates can then be used to determine the enantiomeric excess. Thus, for example, if the degrees of quenching on the enantiomeric polymer aggregates are substantially equal, then the enantiomeric excess of Q is 0 (i.e., if Q is symmetrical, or if Q is a racemic mixture). These binding determinations may be performed, in some cases, without requiring specificity between Q and the sensor, or the separation or isolation of Q into enantiomeric components before the determination of the enantiomeric excess.

While several embodiments of the invention have been described and illustrated herein, those of ordinary skill in the art will readily envision a variety of other means and structures for performing the functions and/or obtaining the results or advantages described herein, and each of such variations or modifications is deemed to be within the scope of the present invention. More generally, those skilled in the art would readily appreciate that all parameters, dimensions, materials, and configurations described herein are meant to be exemplary and that actual parameters, dimensions, materials, and configurations will depend upon specific applications for which the teachings of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, system, material and/or method described herein. In addition, any combination of two or more such features, systems, materials and/or methods, if such features, systems, materials and/or methods are not mutually inconsistent, is included within the scope of the present invention.

In the claims (as well as in the specification above), all transitional phrases such as "comprising," "including," "carrying," "having," "containing," "involving," and the like are to be understood to be open-ended, i.e. to mean including but not limited to. Only the transitional phrases "consisting of" and "consisting essentially of" shall be closed or semi-closed transitional phrases, respectively.

The invention claimed is:

1. An aggregate composition comprising:
   a plurality of polymer molecules, each polymer molecule, prior to aggregation, comprising at least 7 monomer units or having a molecular weight of at least 7000 g/mol, having a fluorescence quantum yield of at least 2%, being electrically conductive or semiconductive, and having electrical properties such that electronic interactions extend at least 2 monomer units from their source such that a spectral comparison of one of the monomer units to the polymer molecule comprising such unit demonstrates a change in gap between the highest filled molecular or electronic orbital and the lowest unfilled molecular or electronic orbital of the monomer unit versus the polymer molecule of at least 0.1 eV,
   the aggregate comprising the polymer molecules arranged in a non-aligned, electronically-communicative manner providing a fluorescence quantum yield for the aggregate at least 0.05 times that of the individual quantum yields of the polymer molecules, an absorption spectrum having a unique, red-shifted absorption relative to an absorption spectrum of a random dispersion of the polymer molecules, and being stable in the absence of solvent for at least one minute in air at no less than 50 degrees Celsius, as indicated by a change in quantum yield of no greater than 5% and a change in wavelength of the unique absorption of no more than 5%.

2. The aggregate composition of claim 1, wherein the polymer molecules are arranged in a manner providing a fluorescence quantum yield for the aggregate at least 0.30 times that of the individual quantum yields of the polymer molecules.

3. The aggregate composition of claim 1, wherein the polymer molecules are arranged in a manner providing a fluorescence quantum yield for the aggregate at least 0.60 times that of the individual quantum yields of the polymer molecules.

4. The aggregate composition of claim 1, wherein each polymer molecule has molecular weight of at least about 12000 g/mol.

5. The aggregate composition of claim 1, wherein each polymer molecule comprises a backbone chain of atoms.

6. The aggregate composition of claim 5, wherein the backbone chain comprises an element selected from the group consisting of carbon, nitrogen, boron, silicon, and germamum.

7. The aggregate composition of claim 5, wherein the backbone chain consists essentially of carbon.

8. The aggregate composition of claim 5, wherein the backbone chain consists essentially of silicon.

9. The aggregate composition of claim 5, wherein each polymer molecule has a persistence of at least about 15 nm.

10. The aggregate composition of claim 1, wherein the aggregate composition is chiral.

11. The aggregate composition of claim 1, wherein the aggregate composition is stable in the absence of solvent for at least one minute in air at no less than 75 deg. C.

12. The aggregate composition of claim 1, wherein the aggregate composition is stable in the absence of solvent for at least one minute in air at no less than 100 deg. C.

13. The aggregate composition of claim 1, wherein the aggregate composition is stable in the absence of solvent for at least about one hour in air.

14. The aggregate composition of claim 1, wherein the aggregate composition is stable in the absence of solvent for at least about one day in air.

15. The aggregate composition of claim 1, wherein the aggregate composition is stable in the absence of solvent for at least about seven days in air.

16. The aggregate composition of claim 1, wherein the aggregate composition is stable in the absence of solvent for at least about thirty days in air.

17. The aggregate composition of claim 1, wherein the aggregate composition is stable in the absence of solvent for at least about 180 days in air.

18. The aggregate composition of claim 1, wherein the aggregate composition is stable in the presence of solvent.

19. The aggregate composition of claim 1, wherein the aggregate composition is a nanoparticle.

20. The aggregate composition of claim 1, wherein the aggregate composition is a colloid.

21. A system comprising the aggregate composition of claim 1, and further comprising a photodetector in optical communication with the aggregate.

22. A diode comprising the aggregate composition of claim 1.

23. A system comprising the aggregate composition of claim 1, and further comprising an electrode able to collect electrons from the aggregate.

24. A photovoltaic device constructed and arranged to convert electromagnetic energy into electrical energy comprising the aggregate composition of claim 1.

25. The aggregate composition of claim 1, further comprising a binding site for a chemical or biological molecule.

26. The aggregate composition of claim 1, wherein the aggregate composition is able to emit circularly polarized light.

27. A sensor comprising the aggregate composition of claim 1, wherein the sensor is able to detect an enantiomeric excess of a molecule in solution.

28. The aggregate composition of claim 1, wherein at least one polymer molecule comprises an aromatic ring.

29. The aggregate composition of claim 1, wherein a fused multicyclic ring structure of at least one polymer molecule produces a three dimensional shape by preventing portions of the polymer molecule from rotating.

30. The aggregate composition of claim 1, wherein at least one polymer molecule comprises a feature able to prevent linearization with a second polymer molecule.

31. The aggregate composition of claim 30, wherein the feature physically prevents linearization.

32. The aggregate composition of claim 31, wherein the feature comprises an iptycene moiety.

33. The aggregate composition of claim 31, wherein the feature comprises a first group and a second group attached to the polymer molecule, the first group having a first fixed height above a plane containing a backbone chain of the polymer and the second group having a second fixed height below the plane, wherein a sum of the first fixed height and second fixed height is at least about 0.45 nanometers.

34. The aggregate composition of claim 31, wherein the feature is chiral.

35. The aggregate composition of claim 31, wherein the feature is shape-persistent.

36. The aggregate composition of claim 30, wherein the feature chemically prevents linearization.

37. The aggregate composition of claim 36, wherein the feature chemically immobilizes the at least one polymer molecule to the second polymer molecule.

38. The aggregate composition of claim 37, wherein the feature chemically immobilizes the at least one polymer molecule to the second polymer molecule via a reaction selected from the group consisting of a free radical polymerization reaction, a metathesis reaction, a 2+2 photocycloaddition reaction, an epoxides ring opening reaction, a condensation reaction, hydrogen bonding, a Diels-Alder cycloaddition reaction, a protein-protein interaction, an interaction between nucleotides, an electrostatic interaction, a metal-ligand interaction, a ligand receptor-interaction and a self-complementary molecular recognition.

39. The aggregate composition of claim 1, wherein at least one polymer molecule comprises a polymer comprising a structure:

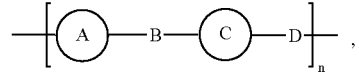

wherein n is at least 1, A and C each comprise an aromatic group, and B and D are selected from the group consisting of a carbon-carbon double bond and a carbon-carbon triple bond.

40. The aggregate composition of claim 39, wherein at least one of A and C comprises a halogen atom.

41. The aggregate composition of claim 39, wherein at least one of A and C comprises an iptycene moiety.

42. The aggregate composition of claim 1, wherein the aggregate composition comprises a crosslinked network structure.

43. The aggregate composition of claim 1, wherein at least some of the polymer molecules are physically intertwined in superhelix bundles within the aggregate.

44. The aggregate composition of claim 1, wherein at least one polymer molecule comprises an iptycene moiety.

45. The aggregate composition of claim 1, wherein the polymer molecules are ordered in a substantially regular arrangement.

46. The aggregate composition of claim 45, wherein the substantially regular arrangement is incapable of relaxing to form an amorphous arrangement.

47. A method comprising:
synthesizing the aggregate composition of claim 1.

48. The method of claim 47, wherein the aggregate composition is formed upon addition of a non-solvent to the polymer molecules.

49. The aggregate composition of claim 1, wherein the fluorescence quantum yield of the plurality of polymer molecules is at least 5%.

50. The aggregate composition of claim 1, wherein the fluorescence quantum yield of the plurality of polymer molecules is at least 20%.

51. An organic light emitting device comprising the aggregate composition of claim 1.

52. A sensor comprising the aggregate composition of claim 1.

53. The sensor of claim 52, wherein the sensor is a chemical sensor.

54. The sensor of claim 52, wherein the sensor is a biological sensor.

55. The sensor of claim 52, wherein at least one polymer molecule includes a chromophore, the aggregate composition being capable of emitting radiation with a quantum yield of at least about 0.05 times that of a quantum yield of the polymer in solution.

56. An explosives sensor comprising the aggregate composition of claim 1.

57. A photodetector comprising the aggregate composition of claim 1.

58. The aggregate composition of claim 1, wherein at least one polymer molecule comprises a polymer comprising a structure:

$[AW]_n,$ wherein n is at least 1, A is a bicyclic moiety, W is a cyclic moiety, and A and W are fused.

59. The aggregate composition of claim 58, wherein W comprises a structure:

$XY_m,$ where m is at least 1, X is a cyclic moiety and Y is a substituent bonded to X.

60. The aggregate composition of claim 58, wherein W is unsaturated.

61. The aggregate composition of claim 58, wherein W is aromatic.

62. The aggregate composition of claim 58, wherein W is heterocyclic.

63. The aggregate composition of claim 58, wherein W comprises a benzene ring.

64. The aggregate composition of claim 58, wherein W is chiral.

65. The aggregate composition of claim 59, wherein Y is chiral.

66. The aggregate composition of claim 58, wherein A comprises a [2.2.2] bicyclic ring system.

67. The aggregate composition of claim 58, wherein A comprises a [2.2.1] bicyclic ring system.

68. The aggregate composition of claim 58, wherein A comprises a [2.1.1] bicyclic ring system.

69. The aggregate composition of claim 58, wherein A comprises oxygen.

70. The aggregate composition of claim 58, wherein A comprises nitrogen.

71. The aggregate composition of claim 1, wherein at least one polymer molecule comprises a polymer comprising a structure:

$[AWB]_n,$ wherein n is at least 1, at least one of A and B is a bicyclic moiety, W is a cyclic moiety, and A and W are fused.

72. The aggregate composition of claim 71, wherein A and B are each bicyclic moieties.

73. The aggregate composition of claim 71, wherein A and B are independently selected.

74. The aggregate composition of claim 71, wherein W comprises a structure:

$XY_m,$ where m is at least 1, X is a cyclic moiety and Y is a substituent bonded to X.

75. The aggregate composition of claim 71, wherein W is unsaturated.

76. The aggregate composition of claim 71, wherein W is aromatic.

77. The aggregate composition of claim 71, wherein W is heterocyclic.

78. The aggregate composition of claim 71, wherein W comprises a benzene ring.

79. The aggregate composition of claim 71, wherein W is chiral.

80. The aggregate composition of claim 74, wherein Y is chiral.

81. The aggregate composition of claim 71, wherein at least one of A and B comprises a [2.2.2] bicyclic ring system.

82. The aggregate composition of claim 71, wherein at least one of A and B comprises a [2.2.1] bicyclic ring system.

83. The aggregate composition of claim 71, wherein at least one of A and B comprises a [2.1.1] bicyclic ring system.

84. The aggregate composition of claim 71, wherein A comprises oxygen.

85. The aggregate composition of claim 71, wherein A comprises nitrogen.

86. The aggregate composition of claim 1, wherein at least one polymer molecule comprises a polymer comprising a structure:

$[W]_n,$ wherein n is at least 1 and W is a cyclic moiety.

87. The aggregate composition of claim 1, wherein W comprises a cyclopentyl ring.

88. The aggregate composition of claim 86, wherein W comprises a structure:

$XY_m,$ where m is at least 1, X is a cyclic compound and Y is a substituent bonded to X.

89. The aggregate composition of claim 88, wherein Y comprises a benzene ring.

90. The aggregate composition of claim 88, wherein Y comprises at least two benzene rings.

91. The aggregate composition of claim 86, wherein W is unsaturated.

92. The aggregate composition of claim 86, wherein W is aromatic.

93. The aggregate composition of claim 86, wherein W is heterocyclic.

94. The aggregate composition of claim 86, wherein W comprises a benzene ring.

95. The aggregate composition of claim 86, wherein W is chiral.

96. The aggregate composition of claim 88, wherein Y is chiral.

97. A method for amplifying an emission, comprising:
providing an article comprising the aggregate composition of claim 1, the aggregate composition comprising a polymer having an energy migration pathway and a chromophore;
exposing the article to a source of energy to form an excitation energy; and
allowing the excitation energy to travel through the migration pathway and to transfer to the chromophore, causing an emission that is greater than an emission resulting from a polymer free of an energy migration pathway.

98. A method for amplifying an emission, comprising:
providing an article comprising the aggregate composition of claim 1, the aggregate composition comprising a polymer having an energy migration pathway, the polymer having reduced pi-stacking;
exposing the article to a source of energy to form an excitation energy; and
allowing the excitation energy to travel through the migration pathway to cause an emission that is greater than an emission resulting from a polymer free of an energy migration pathway.

99. A sensor, comprising:
an article comprising the aggregate composition of claim 1, the aggregate composition comprising a polymeric composition and a chromophore, the article further comprising an activation site wherein the chromophore is capable of activation by an analyte at the activation site; and
an energy migration pathway within the polymeric composition, wherein energy can be transferred between the pathway and the activation site.

100. A sensor comprising the aggregate composition of claim 1, wherein the aggregate composition is capable of emission, and wherein the emission is variable and sensitive to a dielectric constant of a medium surrounding the sensor.

101. A sensor comprising the aggregate composition of claim 1, wherein the aggregate composition capable of emission, and wherein the emission is variable and sensitive to an electric field of a medium surrounding the sensor.

102. An amplification device, comprising:
the aggregate composition of claim 1, the aggregate composition having an energy migration pathway capable of transporting an excitation energy; and
a chromophore in electronic communication with the energy migration pathway, the chromophore being capable of emitting an enhanced radiation.

103. A polymeric composition, comprising:
the aggregate composition of claim 1, the aggregate composition comprising a polymer having a conjugated pi-backbone, the pi-backbone comprising a plane of atoms, a first group and a second group attached to the pi-backbone, the first group having a first fixed height above the plane and the second group having a second fixed height below the plane wherein a sum of the first and second heights is at least about 4.5 Å.

* * * * *

UNITED STATES PATENT AND TRADEMARK OFFICE
CERTIFICATE OF CORRECTION

PATENT NO. : 7,041,910 B2  Page 1 of 1
APPLICATION NO. : 10/621041
DATED : May 9, 2006
INVENTOR(S) : Timothy M. Swager et al.

It is certified that error appears in the above-identified patent and that said Letters Patent is hereby corrected as shown below:

Column 23; Claim 6, line 12 the word "germamum" should read --germanium.--

Signed and Sealed this

Fifteenth Day of August, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,041,910 B2 | Page 1 of 1 |
| APPLICATION NO. | : 10/621041 | |
| DATED | : May 9, 2006 | |
| INVENTOR(S) | : Timothy M. Swager et al. | |

It is certified that error appears in the above-identified patent and that said Letters Patent is hereby corrected as shown below:

In the specification, Column 1, line 14:

At column 1, line 14, please correct the Government Funding to read:

This invention was made with government support under Grant. No. DE-FG07-01ID14222, awarded by DOE, and under Grant No. DAAD19-01-1-0676, awarded by ARO. The government has certain rights in this invention.

Signed and Sealed this

Tenth Day of August, 2010

David J. Kappos
*Director of the United States Patent and Trademark Office*